US011909352B2

(12) United States Patent
Escarra et al.

(10) Patent No.: US 11,909,352 B2
(45) Date of Patent: Feb. 20, 2024

(54) TRANSMISSIVE CONCENTRATED PHOTOVOLTAIC MODULE WITH COOLING SYSTEM

(71) Applicants: The Administrators of the Tulane Educational Fund, New Orleans, LA (US); Qi Xu, San Jose, CA (US); Daniel Codd, San Diego, CA (US); Vince Romanin, San Francisco, LA (US); Nicholas David Farrar-Foley, Milwaukee, WI (US)

(72) Inventors: Matthew David Escarra, New Orleans, LA (US); Qi Xu, San Jose, CA (US); Yaping Ji, New Orleans, LA (US); Brian C. Riggs, New Orleans, LA (US); Adam Ollanik, Boulder, CO (US); Kazi M. Islam, New Orleans, LA (US); Daniel Codd, San Diego, CA (US); Vince Romanin, San Francisco, LA (US); Nicholas David Farrar-Foley, Milwaukee, WI (US)

(73) Assignee: THE ADMINISTRATORS OF THE TULANE EDUCATIONAL FUND, New Orleans, LA (US)

( * ) Notice: Subject to any disclaimer, the term of this patent is extended or adjusted under 35 U.S.C. 154(b) by 0 days.

(21) Appl. No.: 16/089,294

(22) PCT Filed: Mar. 28, 2017

(86) PCT No.: PCT/US2017/024635
§ 371 (c)(1),
(2) Date: Sep. 27, 2018

(87) PCT Pub. No.: WO2017/172841
PCT Pub. Date: Oct. 5, 2017

(65) Prior Publication Data
US 2019/0115869 A1    Apr. 18, 2019

Related U.S. Application Data

(60) Provisional application No. 62/314,230, filed on Mar. 28, 2016.

(51) Int. Cl.
*H02S 40/42*     (2014.01)
*H02S 20/32*     (2014.01)
(Continued)

(52) U.S. Cl.
CPC .......... *H02S 40/425* (2014.12); *H01L 31/048* (2013.01); *H01L 31/052* (2013.01);
(Continued)

(58) Field of Classification Search
CPC ....................................................... H02S 40/44
See application file for complete search history.

(56) References Cited

U.S. PATENT DOCUMENTS 4,392,008 A * 7/1983 Cullis ................. H01L 31/0521
136/248
5,273,911 A    12/1993 Sasaki et al.
(Continued)

FOREIGN PATENT DOCUMENTS

DE    29 39 486 A1    4/1981
FR    2 432 147 A1    2/1980
(Continued)

OTHER PUBLICATIONS

Australian Examination Report in Australian Patent Application No. 2014279582, dated Dec. 5, 2019, 3 pages.
(Continued)

*Primary Examiner* — Kourtney R S Carlson
(74) *Attorney, Agent, or Firm* — Cozen O'Connor

(57) ABSTRACT

A spectrum splitting, transmissive concentrating photovoltaic (tCPV) module is proposed and designed for a hybrid photovoltaic-solar thermal (PV/T) system. The system may be able to fully utilize the full spectrum of incoming sunlight. By utilizing III-V triple junction solar cells with bandgaps of approximately 2.1 eV, 1.7 eV, and 1.4 eV in the module, ultraviolet (UV) and visible light (in-band light) are absorbed and converted to electricity, while infrared (IR) light (out-of-band light) passes through and is captured by a solar thermal receiver and stored as heat. The stored heat energy may be dispatched as electricity or process heat as needed. The tCPV module may have an overall power conversion efficiency exceeding 43.5% for above bandgap (in-band) light under a standard AM1.5D solar spectrum with an average concentration ratio of 400 suns. Passive and/or active cooling methods may be used to keep cells below 110° C. while transmitting >75% of out-of-band light to the thermal receiver, which may attain thermal energy capture at temperatures as high as 500° C. or more. A transparent active cooling system may improve the CPV module efficiency by about 1% (absolute) relative to a passive cooling system by reducing the maximum cell working temperature by about 16° C.

19 Claims, 29 Drawing Sheets

(51) Int. Cl.
  *H02S 40/22* (2014.01)
  *H02S 40/44* (2014.01)
  *H01L 31/048* (2014.01)
  *H01L 31/052* (2014.01)
  *H01L 31/0687* (2012.01)
  *H01L 31/0693* (2012.01)

(52) U.S. Cl.
  CPC ...... *H01L 31/0521* (2013.01); *H01L 31/0687* (2013.01); *H01L 31/0693* (2013.01); *H02S 20/32* (2014.12); *H02S 40/22* (2014.12); *H02S 40/42* (2014.12); *H02S 40/44* (2014.12); *Y02E 10/52* (2013.01); *Y02E 10/60* (2013.01)

(56) References Cited

U.S. PATENT DOCUMENTS

| | | | |
|---|---|---|---|
| 6,200,712 B1* | 3/2001 | Fan | G02B 5/201 |
| | | | 257/E31.128 |
| 6,340,788 B1 | 1/2002 | King et al. | |
| 7,745,723 B2 | 6/2010 | Dyson | |
| 8,772,628 B2 | 7/2014 | Wanlass et al. | |
| 2002/0117675 A1 | 8/2002 | Mascarenhas | |
| 2002/0189662 A1* | 12/2002 | Lomparski | H01L 31/0521 |
| | | | 136/246 |
| 2004/0055631 A1 | 3/2004 | Kazimierz et al. | |
| 2004/0103680 A1* | 6/2004 | Lasich | F24S 40/55 |
| | | | 62/259.2 |
| 2006/0162768 A1 | 7/2006 | Wanlass et al. | |
| 2008/0135087 A1 | 6/2008 | Anikara | |
| 2009/0032088 A1* | 2/2009 | Rabinowitz | H01L 31/048 |
| | | | 136/251 |
| 2009/0146049 A1 | 6/2009 | Hsieh et al. | |
| 2009/0266395 A1 | 10/2009 | Murthy et al. | |
| 2009/0288705 A1* | 11/2009 | Hiwatashi | H01G 9/20 |
| | | | 136/256 |
| 2010/0147366 A1* | 6/2010 | Stan | H01L 31/056 |
| | | | 136/255 |
| 2010/0186804 A1 | 7/2010 | Cornfeld | |
| 2010/0229908 A1 | 9/2010 | Van Steenwyk et al. | |
| 2010/0229913 A1 | 9/2010 | Cornfeld | |
| 2010/0294264 A1 | 11/2010 | Link | |
| 2011/0132434 A1* | 6/2011 | Correia | F24S 23/74 |
| | | | 136/248 |
| 2011/0168234 A1 | 7/2011 | Lasich et al. | |
| 2011/0232723 A1 | 9/2011 | Ostermann | |
| 2011/0240008 A1 | 10/2011 | Kesseli et al. | |
| 2012/0006383 A1 | 1/2012 | Donnelly | |
| 2012/0037206 A1* | 2/2012 | Norman | H01L 31/02 |
| | | | 136/246 |
| 2012/0097216 A1 | 4/2012 | Qinglong et al. | |
| 2012/0138047 A1 | 6/2012 | Ashkin et al. | |
| 2012/0174582 A1* | 7/2012 | Moussavi | H01L 31/0547 |
| | | | 60/641.8 |
| 2012/0186623 A1 | 7/2012 | Bulovic et al. | |
| 2012/0266936 A1* | 10/2012 | Weibezahn | H01L 31/0547 |
| | | | 136/246 |
| 2012/0273030 A1 | 11/2012 | Jee | |
| 2012/0312351 A1 | 12/2012 | Knox | |
| 2013/0014813 A1 | 1/2013 | Wang et al. | |
| 2013/0199595 A1 | 8/2013 | Martin et al. | |
| 2013/0270589 A1 | 10/2013 | Kayes et al. | |
| 2013/0298557 A1 | 11/2013 | Treece et al. | |
| 2014/0034117 A1 | 2/2014 | Wiesenfarth et al. | |
| 2014/0060613 A1 | 3/2014 | So et al. | |
| 2014/0083481 A1 | 3/2014 | Hebrink et al. | |
| 2014/0126062 A1 | 5/2014 | Heo et al. | |
| 2014/0261636 A1 | 9/2014 | Anderson | |
| 2014/0318620 A1 | 10/2014 | Kare et al. | |
| 2015/0083192 A1 | 3/2015 | Nobori | |
| 2015/0372640 A1 | 12/2015 | Yang et al. | |
| 2016/0322933 A1 | 11/2016 | Escher et al. | |
| 2016/0341498 A1 | 11/2016 | Lynn et al. | |
| 2018/0108794 A1 | 4/2018 | Aiken | |
| 2018/0138352 A1 | 5/2018 | Aiken et al. | |

FOREIGN PATENT DOCUMENTS

| | | |
|---|---|---|
| FR | 2 515 169 A1 | 4/1983 |
| JP | 02224375 A | 9/1990 |
| JP | 2013 245877 A | 12/2013 |
| RU | 2 048 661 C1 | 11/1995 |
| WO | WO 97/11321 A1 | 3/1997 |
| WO | WO 2012076847 A1 | 6/2012 |
| WO | WO 2015200927 A1 | 12/2015 |

OTHER PUBLICATIONS

PCT/US2018/019782 International Search Report and Written Opinion dated Jun. 14, 2018, 12 pp.
Jilte et al (2014) "Investigation on Convective Heat Losses from Solar Cavities under Wind Conditions," Energy Procedia, vol. 57, pp. 437-446. [Retrieved from the Internet: https://www.sciencedirect.com/science/article/pii/S1876610214015641].
All About Temp-Plate. Brochure [online], Paul Mueller Company, 2008, pp. 2-7,10,12,14-16. [Retrieved from the Internet: http://www.gwindustrial.com/pdf/Mueller/Mueller_All_About_Temp-Plate.pdf].
U.S. Appl. No. 15/322,417, Final Office Action dated Jan. 29, 2020, 21 pp.
PCT/US2017/024635 International Search Report and Written Opinion dated Jul. 10, 2017, 13 pp.
International Search Report and Written Opinion of PCTUS2015/038396 dated Sep. 24, 2015, 11 pp.
Extended European Search Report of EP 15811185.6 dated Feb. 27, 2018, 8 pp.
U.S. Appl. No. 16/497,699, Non-Final Office Action dated Apr. 15, 2021, 12 pages.
U.S. Appl. No. 16/497,699 Final Office Action dated Nov. 12, 2021, 13 pages.
U.S. Appl. No. 15/322,417 Notice of Allowance dated May 12, 2021, 12 pages.

(56) References Cited

OTHER PUBLICATIONS

European Patent Application No. 18756709.4; Extended European Search Report and Opinion dated Nov. 20, 2020; 14 pgs.

* cited by examiner

Partial Section "A-A"

TRANSMISSIVE CONCENTRATED PHOTOVOLTAIC MODULE WITH COOLING SYSTEM

CROSS-REFERENCES TO RELATED APPLICATIONS

This application claims priority from U.S. Provisional Application No. 62/314,230, filed Mar. 28, 2016, which is incorporated herein by reference as if set forth in full below.

STATEMENT REGARDING FEDERALLY SPONSORED RESEARCH

The invention was made with U.S. Government support from the Advanced Research Projects Agency—Energy, U.S. Department of Energy, under contract number DEAR0000473. The United States Government has certain rights in the invention.

BACKGROUND OF THE INVENTION

I. Field of the Invention

The present invention relates to a spectrum splitting, transmissive concentrating photovoltaic (tCPV) module with active and passive cooling systems and to a method for converting solar energy to electricity at high efficiencies while capturing solar thermal energy.

II. Background

As a promising renewable energy, solar power has gained increasing attention from worldwide researchers during recent years. From photovoltaic (PV) solar cells to concentrating solar thermal (a.k.a. concentrating solar power—CSP), various solar technologies have been applied in order to most efficiently utilize the sun as an energy resource. Combining photoelectric and photothermal conversion processes via hybrid PV and solar thermal (PV/T) systems is a promising way to optimally utilize the full solar spectrum to generate electricity and heat energy with very high efficiency. The PV cells, typically the most expensive component in the system, may be utilized in a much more economical way by employing concentrating approaches to reduce the PV area required to convert a given amount of solar power to electricity, gaining improved efficiency in the process.

PV/T systems without concentrating approaches generate a relatively low working temperature—typically less than 100° C.—and have been widely investigated. However, concentrating PV (CPV)—solar thermal (CPV/T) systems face a number of challenges, including a need to maintain reasonably low cell temperatures at typically less than 110° C. while allowing for thermal energy capture at much higher temperatures, up to 500° C. or more. Studies have been done on CPV/T systems to investigate a variety of applications and effects, such as solar cooling, spectrum splitting, and thermoelectric conversion. It has been shown that the PV cells may act as heat absorbers in a hybrid CPV/T system for commercial use. Higher operating temperature CPV modules have been investigated to allow the system to operate at higher temperature. The influence of irradiance and temperature on CPV cells has been studied to find the optimal parameters of a CPV module. In many cases, efficiency and performance is limited by either inefficient spectrum splitting or a mismatch between the need to keep cell temperatures low (for efficiency and reliability purposes) while allowing high thermal output temperatures (for maximizing thermal exergy and meeting the needs of higher temperature applications).

The present invention provides a transmissive, spectrum splitting concentrating photovoltaic (tCPV) module for use in a hybrid concentrating photovoltaic-solar thermal (CPV/T) system. By utilizing III-V triple junction solar cells in the tCPV module with a lowest bandgap around 1.4 eV, ultraviolet (UV) and visible light is directly absorbed and converted to electricity, while infrared (IR) light will pass through the cells and module to be captured by a solar thermal receiver and stored as heat. This spectrum splitting approach is angle-insensitive and is much more efficient than other spectrum splitting approaches. The tCPV module may be kept below 110° C., where cells optimally perform, while the thermal receiver may heat the heat transfer fluid (HTF) to greater than 570° C. The tCPV module shows an overall energy conversion efficiency of around 43.5% for the above-bandgap (defined as in-band) light, while transmitting below-bandgap (defined as out-of-band) light with approximately 75% transmission efficiency.

In addition, the thermal output, which can be tuned from 100° C. to 570° C. depending on need, may be used in commercial and industrial process heat markets, such as solar heating and cooling, desalinization, enhanced oil recovery, refining, food processing, and more.

While certain novel features of this invention shown and described below are pointed out in the annexed claims, the invention is not intended to be limited to the details specified, since a person of ordinary skill in the relevant art will understand that various omissions, modifications, substitutions and changes in the forms and details of the invention illustrated and in its operation may be made without departing in any way from the spirit of the present invention. No feature of the invention is critical or essential unless it is expressly stated as being "critical" or "essential."

SUMMARY OF THE INVENTION

The present invention provides a transmissive, spectrum-splitting photovoltaic module that may be suitable for use in a hybrid concentrating photovoltaic-solar thermal system.

In accordance with this discovery, it is an object of the invention to provide a photovoltaic module with an active cooling system or a passive cooling system to allow efficient operation of the photovoltaic module at low temperature while facilitating heat transfer for use in the thermal subsystem at high temperature.

One embodiment of the present invention is an apparatus for collecting solar energy, which comprises a photovoltaic module comprising one or more photovoltaic cells, wherein said one or more photovoltaic cells, when exposed to solar radiation, allow some portion of said solar radiation to pass through said one or more photovoltaic cells; and a cooling system, wherein said cooling system is operable to cool said photovoltaic module, and wherein said cooling system allows some portion of said solar radiation to pass through said cooling system.

In another embodiment of the present invention, said cooling system comprises a passive cooling system, where said passive cooling system further comprises a heat sink and a lateral heat conducting layer, wherein said passive cooling system is in physical contact with said photovoltaic module. In another embodiment of the present invention, wherein photovoltaic module further comprises a lateral heat conducting layer and said cooling system comprises a passive cooling system, wherein said passive cooling system further comprises a heat sink, and wherein said photovoltaic module is fixed within said heat sink such that said lateral heat conducting layer is in physical contact with said heat sink.

In another embodiment of the present invention, cooling system comprises an active cooling system, said active cooling system comprising: a transmissive base attached to said photovoltaic module; one or more microfluidic channels positioned within or on top of said base; and an amount of heat transfer fluid contained within said one or more microfluidic channels.

Other objects and advantages of this invention will become readily apparent from the ensuing description.

DESCRIPTION OF THE DRAWINGS

The following drawings form part of the present specification and are included to further demonstrate certain aspects of the present invention. The invention may be better understood by reference to one or more of these drawings in combination with the description of specific embodiments presented herein.

DETAILED DESCRIPTION OF THE INVENTION

Figure 1:
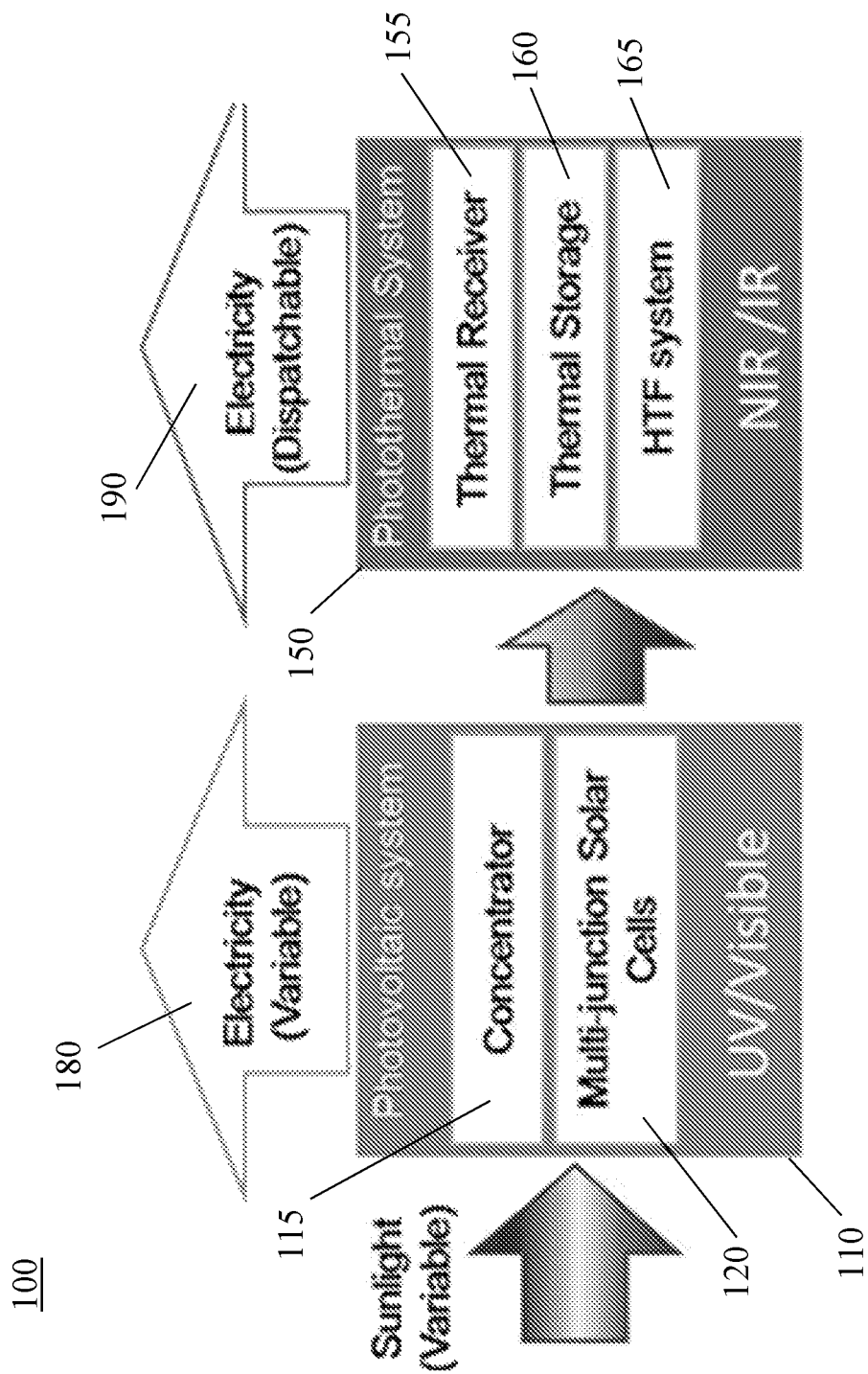
FIG. 1 shows a schematic diagram of the tCPV-based PV/T system.

Detailed descriptions of one or more preferred embodiments are provided herein. It is to be understood, however, that the present invention may be embodied in various forms. Therefore, specific details disclosed herein are not to be interpreted as limiting, but rather as a basis for the claims and as a representative basis for teaching one skilled in the art to employ the present invention in any appropriate manner.

Wherever any of the phrases "for example," "such as," "including" and the like are used herein, the phrase "and without limitation" is understood to follow unless explicitly stated otherwise. Similarly "an example," "exemplary" and the like are understood to be non-limiting.

The term "substantially" allows for deviations from the descriptor that do not negatively impact the intended purpose. Descriptive terms are understood to be modified by the term "substantially" even if the word "substantially" is not explicitly recited. Therefore, for example, the phrase "wherein the lever extends vertically" means "wherein the lever extends substantially vertically" so long as a precise vertical arrangement is not necessary for the lever to perform its function.

The terms "comprising" and "including" and "having" and "involving" (and similarly "comprises", "includes," "has," and "involves") and the like are used interchangeably and have the same meaning. Specifically, each of the terms is defined consistent with the common United States patent law definition of "comprising" and is therefore interpreted to be an open term meaning "at least the following," and is also interpreted not to exclude additional features, limitations, aspects, etc. Thus, for example, "a process involving steps a, b, and c" means that the process includes at least steps a, b and c. Wherever the terms "a" or "an" are used, "one or more" is understood, unless such interpretation is nonsensical in context.

In one embodiment, the present invention provides a photovoltaic module comprising at least one substrate; a plurality of electrodes attached to the at least one substrate; a plurality of photovoltaic cells attached to the plurality of electrodes; at least one superstrate attached to the plurality of photovoltaic cells; and at least one cooling system. The at least one substrate may be comprised of sapphire, fused quartz, fused silica, borosilicate glass, NBK7 glass, or any other appropriate material. The photovoltaic module may further comprise one or more channels positioned within or on top of the at least one substrate. The one or more channels may be fixed within or on top of the at least one substrate by at least one method selected from the group comprising wet chemical process, dry etch process, laser machining, or mechanical micromachining. The plurality of electrodes may be comprised of embedded electrodes and wires, and the plurality of electrodes may be formed through inkjet printing, doctor blading, or electrodeposition and comprised of silver, copper, or any other appropriate material.

The plurality of photovoltaic cells attached to the plurality of electrodes may comprise multi-junction photovoltaic cells. In some embodiments, the multi-junction photovoltaic cells comprise triple junction photovoltaic cells. The triple junction photovoltaic cells may comprise bandgaps of about 2.10 eV, about 1.67 eV, and about 1.42 eV. The at least one superstrate may be comprised of sapphire, fused quartz, fused silica, IR fused silica, borosilicate glass, NBK7 glass, or any other appropriate material between 1 and 5 mm thick, and the at least one superstrate may be attached to the plurality of photovoltaic cells by indium alloy paste, indium alloy paint, or any other appropriate bonding agent. In some embodiments, the photovoltaic module may further comprise at least one encapsulant, such as polysiloxane.

In some embodiments, the at least one cooling system may comprise a passive cooling system. The passive cooling system may comprise at least one transparent lateral heat conducting layer, which may be the same layers as the aforementioned substrate and superstrate layers (see, e.g., superstrate 440 and substrate 430), and one or more heat sinks attached to the at least one lateral heat conducting layer. The at least one lateral heat conducting layer may be comprised of a highly transparent material that also has good thermal conductivity, such as sapphire. The one or more heat sinks may be comprised of a high thermal conductivity material, such as aluminium alloy, and the one or more heat sinks may be formed through stamping, machining, laser cutting, water jet cutting, or any other appropriate process. The one or more heat sinks may be attached to the at least one lateral heat conducting layer through a slot fit design, a shrink fit process, a thermally conducting epoxy, or similar thermally conducting material. In some embodiments, the one or more heat sinks may be positioned in an orientation selected from the group comprising flushed, flared, or inverted, radially surrounding the one or more lateral heat conducting layers. The at least one substrate, the plurality of electrodes attached to the at least one substrate, the plurality of photovoltaic cells attached to the plurality of electrodes, and the at least one superstrate attached to the plurality of photovoltaic cells may be fixed onto or include the one or more lateral heat conducting layers and placed within the heat sink through a shrink fit or clamping method or any other appropriate means.

In some embodiments, the at least one cooling system may comprise an active cooling system. The active cooling system may comprise at least one transparent base attached to the at least one substrate, the plurality of electrodes attached to the at least one substrate, the plurality of photovoltaic cells attached to the plurality of electrodes, and the at least one superstrate attached to the plurality of photovoltaic cells; one or more channels positioned within or on top of the at least one base; and a predetermined amount of heat transfer fluid contained within the one or more channels. The at least one base may be comprised of sapphire, fused quartz, fused silica borosilicate glass, NBK7 glass, or any other appropriate material. The at least one base may be attached to the at least one substrate, the plurality of electrodes attached to the at least one substrate, the plurality of photovoltaic cells attached to the plurality of electrodes, and the at least one superstrate attached to the plurality of photovoltaic cells by a plasma bonding process, direct polymer fixation, or thermal curing process.

The one or more channels may be about 50 microns deep to about 200 microns deep. The active cooling system may further comprise inlet and outlet holes in each end of the one or more channels. The at least one base may be positioned such that the predetermined amount of heat transfer fluid contained within the one or more channels is delivered to the bottom of the plurality of photovoltaic cells. The active cooling system may further comprise at least one transparent optical adhesive attached to the at least one base in non-channel regions, such as polysiloxane or optically transparent photoresist.

In some embodiments, the active cooling system may further comprise at least one connection piece connected to the one or more channels; one or more fluid pumps functionally connected to the one or more channels and the at least one connection piece; and at least one heat exchanger functionally connected to the at least one connection piece. The at least one connection piece may comprise a collar, which may be comprised of a high thermal conductivity material such as aluminium alloy.

The at least one connection piece may further comprise one or more interior manifold channels functionally connected to the one or more fluid pumps and the one or more channels positioned within or on top of the at least one base. The one or more manifold channels may be functionally connected to the at least one heat exchanger. The predetermined amount of heat transfer fluid may comprise water, water with ethylene glycol, synthetic oils, or any other appropriate fluid. In some embodiments, the photovoltaic module may comprise one or more passive cooling systems and one or more active cooling systems.

In one embodiment, the hybrid system 100 may be principally composed of the photovoltaic sub-system 110 and the solar thermal sub-system 150, as illustrated in FIG. 1. The PV sub-system 110 contains the concentrator 115 and the multi-junction solar cells 120, and only absorbs incoming photons with energy above the lowest bandgap of the solar cells (mainly UV and visible light) to directly generate variable electric power 180. The solar thermal sub-system 150 contains the thermal receiver 155, the thermal storage 160, and the HTF system 165. Solar thermal sub-system 150 captures the transmitted photons with energy lower than the lowest solar cell bandgap (mainly IR light) and converts the captured photons to dispatchable thermal power 190. This thermal power 190 may be converted to electricity by a suitable heat engine or used directly for process heat applications. The hybrid system 100 splits the solar spectrum and utilizes it in two different sub-systems. The multi-junction solar cells 120 in the PV sub-system most efficiently convert high energy photons to electricity, as the $V_{oc}$-bandgap offset ($W_{oc}$) is somewhat independent of bandgap. The thermal system 150 is less sensitive to incoming photon energy and is more efficient at utilizing IR photons.

Figure 2:
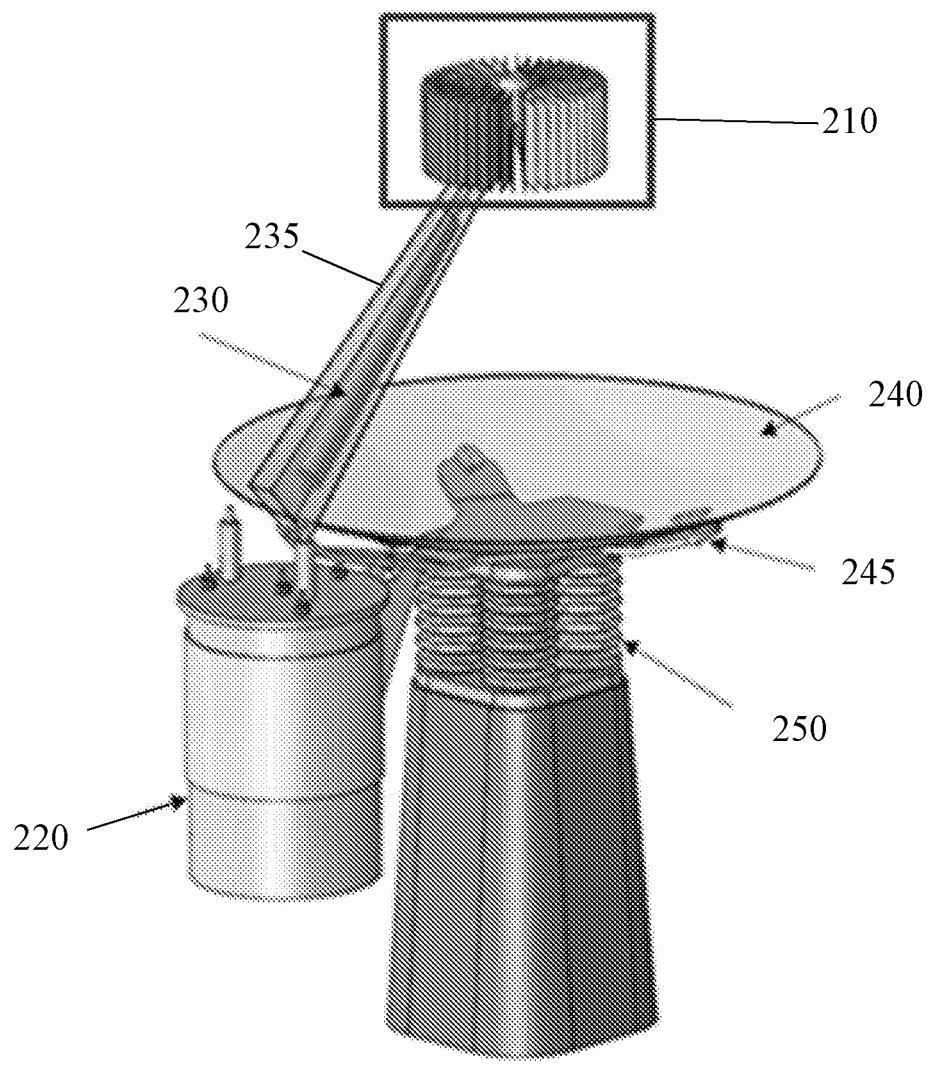
FIG. 2 shows a 3-D model of the PV/T system.
Figure 3:
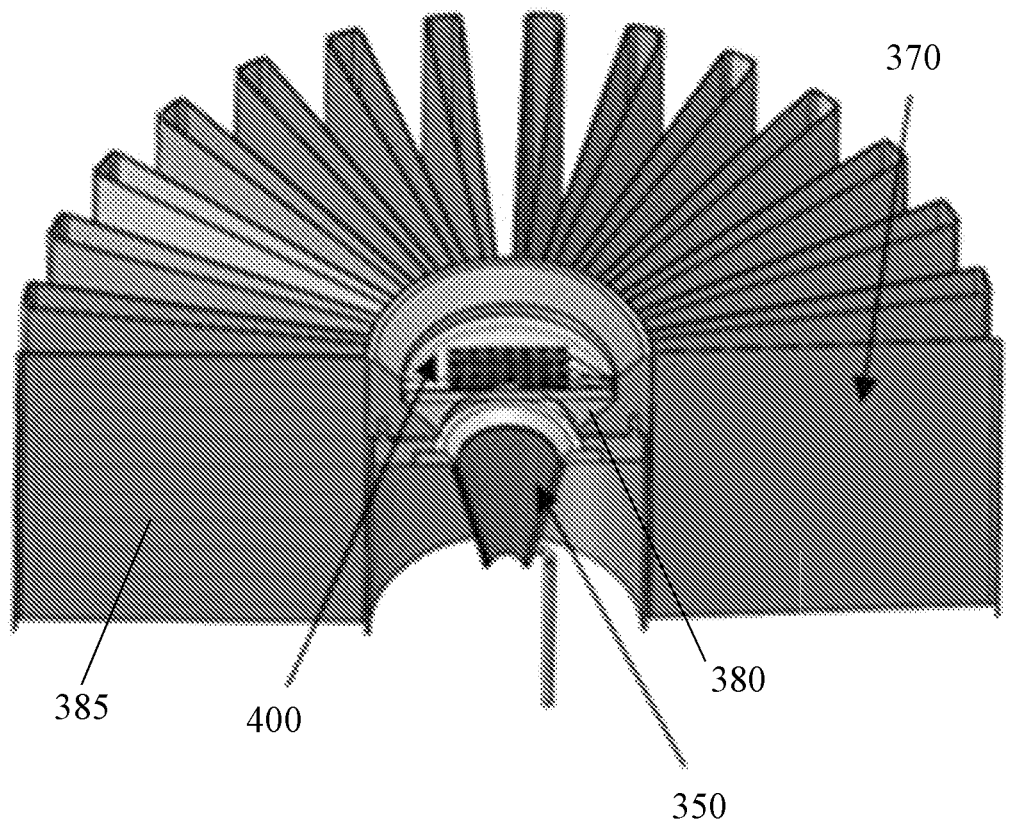
FIG. 3 shows a 3-D cross-sectional view of the tCPV module integrated with the thermal receiver.
Figure 4:
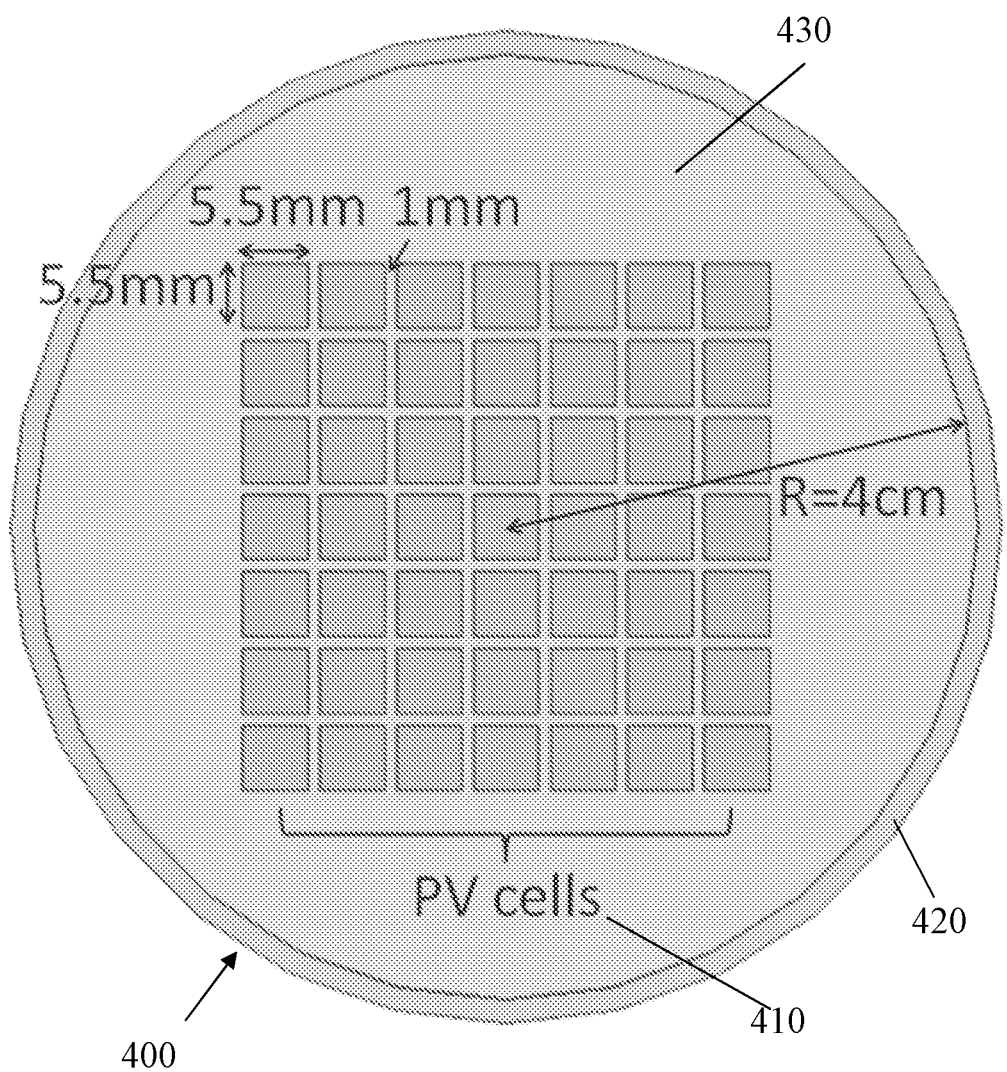
FIG. 4 shows a planar view of the tCPV module.

The specific design of one embodiment of a tCPV-based PV/T system may be seen in FIGS. 2-4. The PV module 400 with thermal receiver 350 is marked with a black line (see FIG. 2). Heat is conducted from the thermal receiver 350 to the thermal energy storage (TES) tank 220 through a HTF piping system 230 (which runs through support arm 235). A parabolic dish 240 concentrates the incident light onto the transmissive PV 400 and thermal receiver 350, dramatically increasing illumination intensity on the solar cells 410, enhancing efficiency and reducing cell cost. Both support arm 235 and parabolic dish 240 are connected to support structure 245, which is itself connected to actuator 250. A simple, low-cost, and effective bellows-based actuator 250 may be used as a two-axis solar tracking system to allow the system to receive maximum irradiation throughout the day and the changing seasons.

FIG. 3 shows the details of one embodiment of the receiver 210. The tCPV module 400 is placed directly preceding the thermal receiver 350 along the optical axis of the concentrator 240. In this embodiment, the concentrated solar light will be first absorbed by the tCPV module 400, with most of the remaining light passing through the module 400 and reaching the thermal receiver 350. Due to the high concentration ratio of ~500 suns on average at the tCPV, the temperature of the cells 410 becomes much higher than ambient temperature, leading to a reduction in cell conversion efficiency. A radial fin heatsink 370 may be placed around the tCPV module 400, allowing for passive cooling without blocking transmitted light. In some embodiments, the radial fins 385 of the heatsink may be metallic. Through the use of the radial fin heatsink 370, heat is conducted out of the tCPV 400 and disbursed into the air via convection to reduce the module temperature, as shown schematically in FIG. 23.

Figure 5:
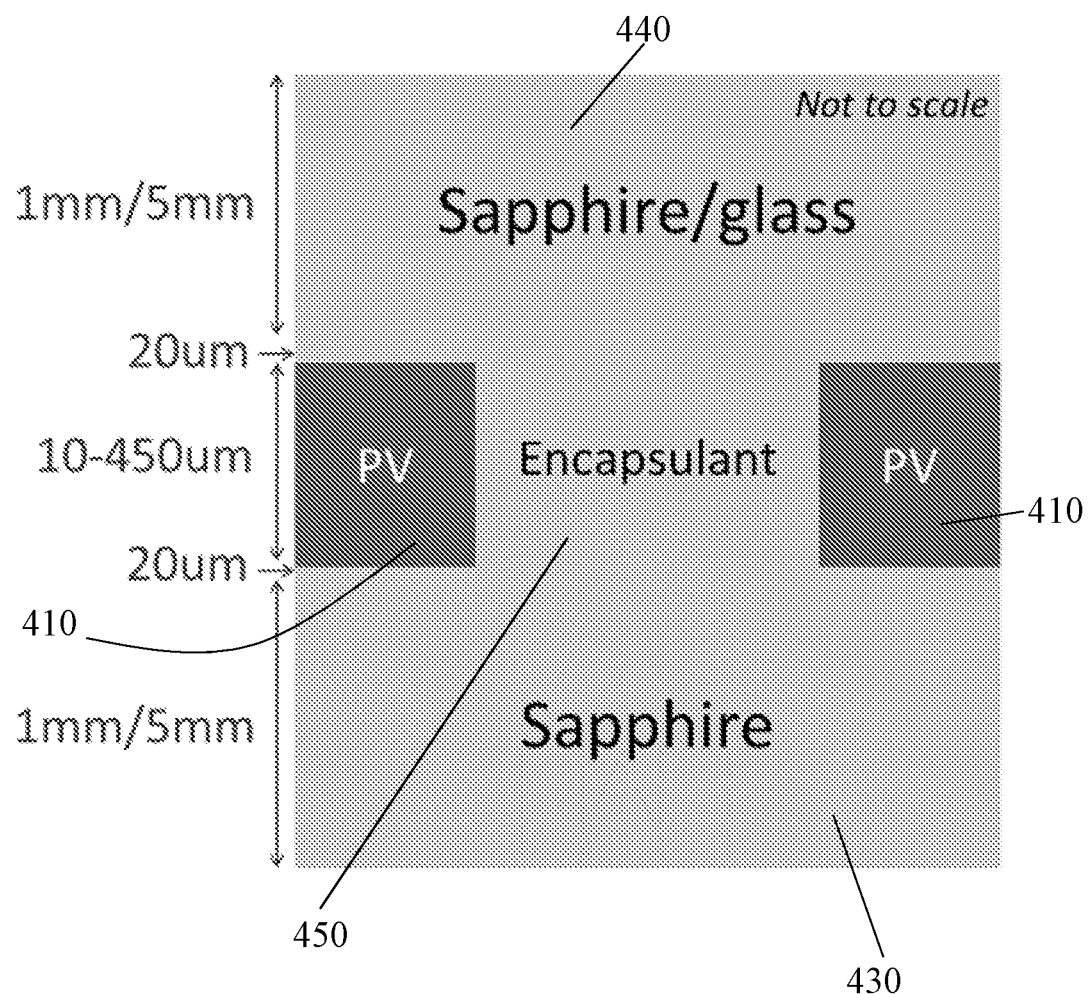
FIG. 5 shows a cross-sectional view of the tCPV module.

In some embodiments, the tCPV module 400 comprises 49 triple-junction cells grown on GaAs substrates and arranged in a 7×7 array, as shown in FIG. 4. In the embodiment shown, the size of each cell is about 5.5 mm×about 5.5 mm, and there is an about 1 mm gap between neighbouring cells. The cell array is placed on a round substrate 430 with a radius R of about 4 cm and a thickness of about 5 mm. In some embodiments, the substrate 430 is comprised of sapphire. In the embodiment shown in FIG. 4, a metal frame 420 surrounds substrate 430 and is attached thereto, where said frame is approximately 2 mm in thickness. Another about 5 mm thick wafer is placed above the cells as a superstrate 440, and encapsulant 450 is used to fill in the space between the superstrate 440 and the PV cells 410 as a sealing material, as shown in FIG. 5. The superstrate 440 may be comprised of sapphire, and in some embodiments, the encapsulant 450 comprises a silicon encapsulant.

Some embodiments utilize sapphire instead of traditional glass as the superstrate and substrate due to its relatively high thermal conductivity and optical transparency. Heat from the cells may be extracted laterally through the sapphire to the encircling radial heatsink. The triple-junction solar cells may retain their GaAs substrate, resulting in a total thickness of around 450 μm. In some embodiments, epitaxial lift-off (ELO) multi-junction solar cells may be used, providing enhanced optical transmission of IR light with potentially higher efficiency and lower cost. In order to minimize cell temperature rise during operation, only a thin layer of the relatively low thermal conductivity encapsulant may be left on the top surface and bottom surface of the cells, which are approximately 50 μm and 20 μm thick, respectively.

Example 1

Results and Discussion

Figure 6:
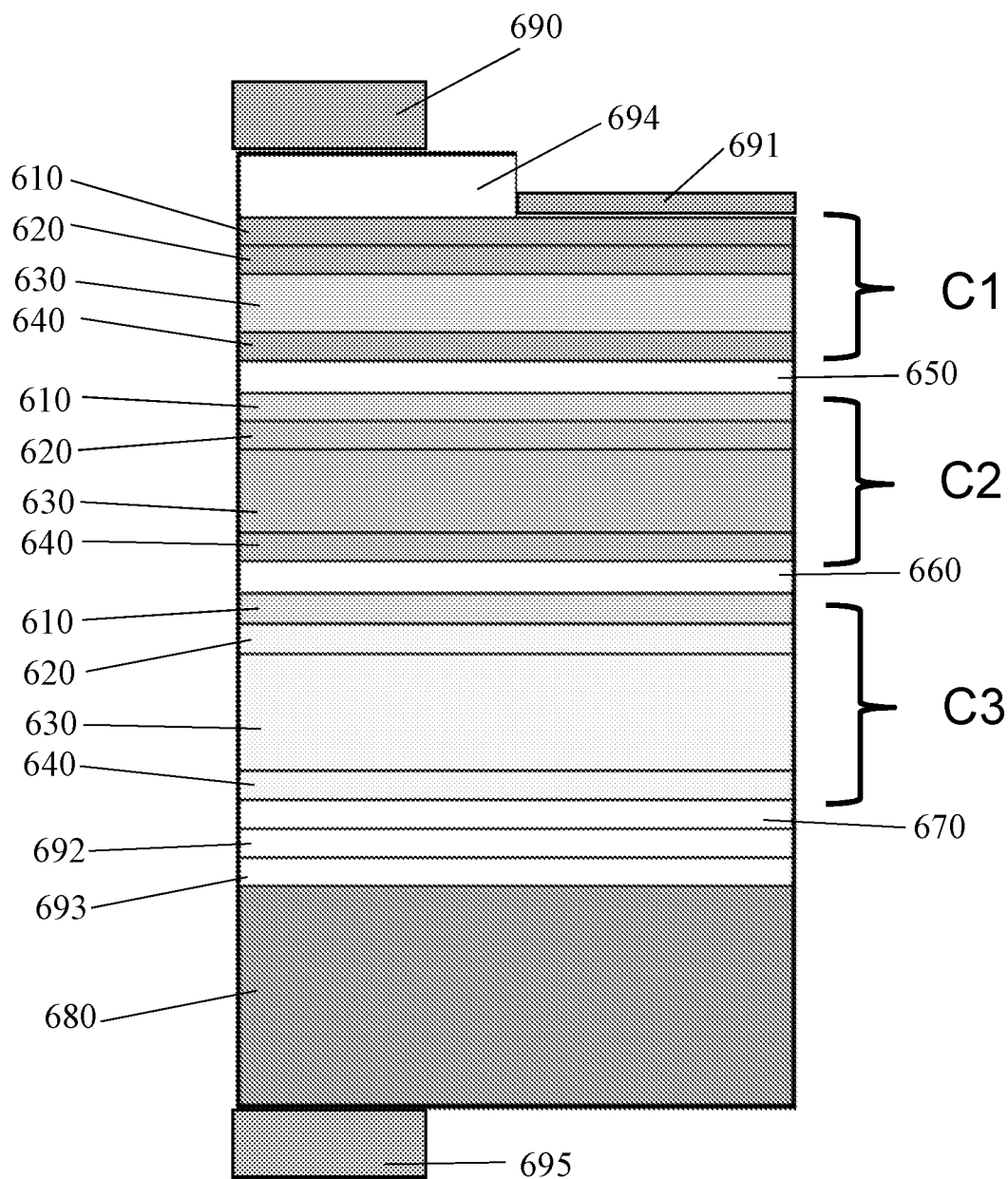
FIG. 6 shows the structure of one embodiment of the CPV tandem cell.

FIG. 6 shows the structure of triple-junction solar cells used in this embodiment of the tCPV module, with top subcell C1, middle subcell C2, and bottom subcell C3. Each subcell includes a window layer 610, emitter layer 620, base layer 630, and back surface field (BSF) layer 640. Tunnel junctions 650 and 660, which produce effective potential barriers for minority carriers, may be utilized between subcells and designed for high injection levels (high concentration). A polarity reversing tunnel junction (PR TJ) 670 may be used after C3 to enable the use of a n-type GaAs:Si growth substrate 680 with carrier concentration of 0.8-3e17 $cm^{-3}$, which may minimize absorption of transmitted out-of-band photons while maintaining sufficient conductivity for carrier collection at the back electrodes. The front and back contacts 690 and 695 are designed to minimize shadowing of transmitted light and to minimize resistive losses in current collection; the grid fingers and busbar on each side are co-aligned to further reduce transmission losses. Also shown are N+ cap layer 691, anti-reflective coating 694, buffer layer 692, and nucleation layer 693.

Even though the absorption of the GaAs substrate 680 is relatively low in the out-of-band IR wavelengths, this absorption may be negated with the incorporation of an ELO process in cell fabrication, dramatically reducing the total cell thickness from ~450 μm to ~10 μm. This reduction in thickness may save materials costs, reduce IR absorption, and potentially enhance cell performance, offset slightly by some increase in the difficulty of cell fabrication and module assembly.

Figure 7:
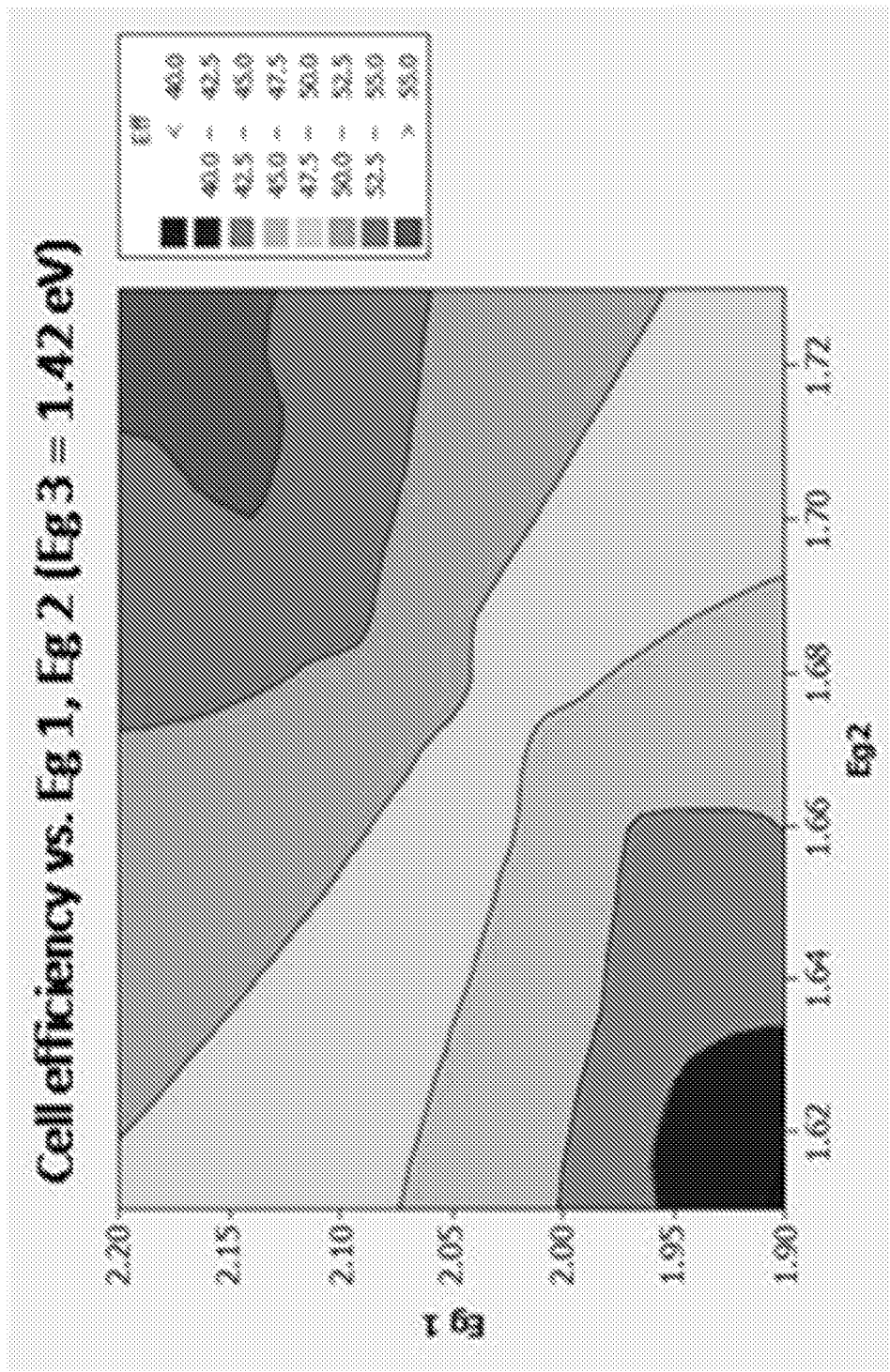
FIG. 7 shows an efficiency map vs. different bandgap of subcells 2 and 3, with subcell 1 bandgap fixed at 1.42 eV.

For the embodiment shown in FIG. 6, the materials and bandgap selection of each subcell are: AlGaInP for C1 with bandgap of about 2.10 eV, AlGaAs for C2 with bandgap of about 1.67 eV, and GaAs for C3 with bandgap of about 1.42 eV. The material and alloy composition for each subcell may be determined by the requirements for lattice-matching and current-matching, with the goal of maximum conversion efficiency for in-band light. FIG. 7 shows the calculated power conversion efficiency of the triple-junction solar cells versus the bandgap of the top cell (Eg1) and middle cell (Eg2), where the bottom cell bandgap (Eg3) is fixed at 1.42 eV, corresponding with GaAs. It should be noted that the efficiency plotted in FIG. 7 is for conversion of in-band light only and does not include ohmic or reflection losses. By adjusting the bandgaps of each subcell, the performance of the tandem solar cell may be optimized for maximum in-band power conversion efficiency.

Figure 8:
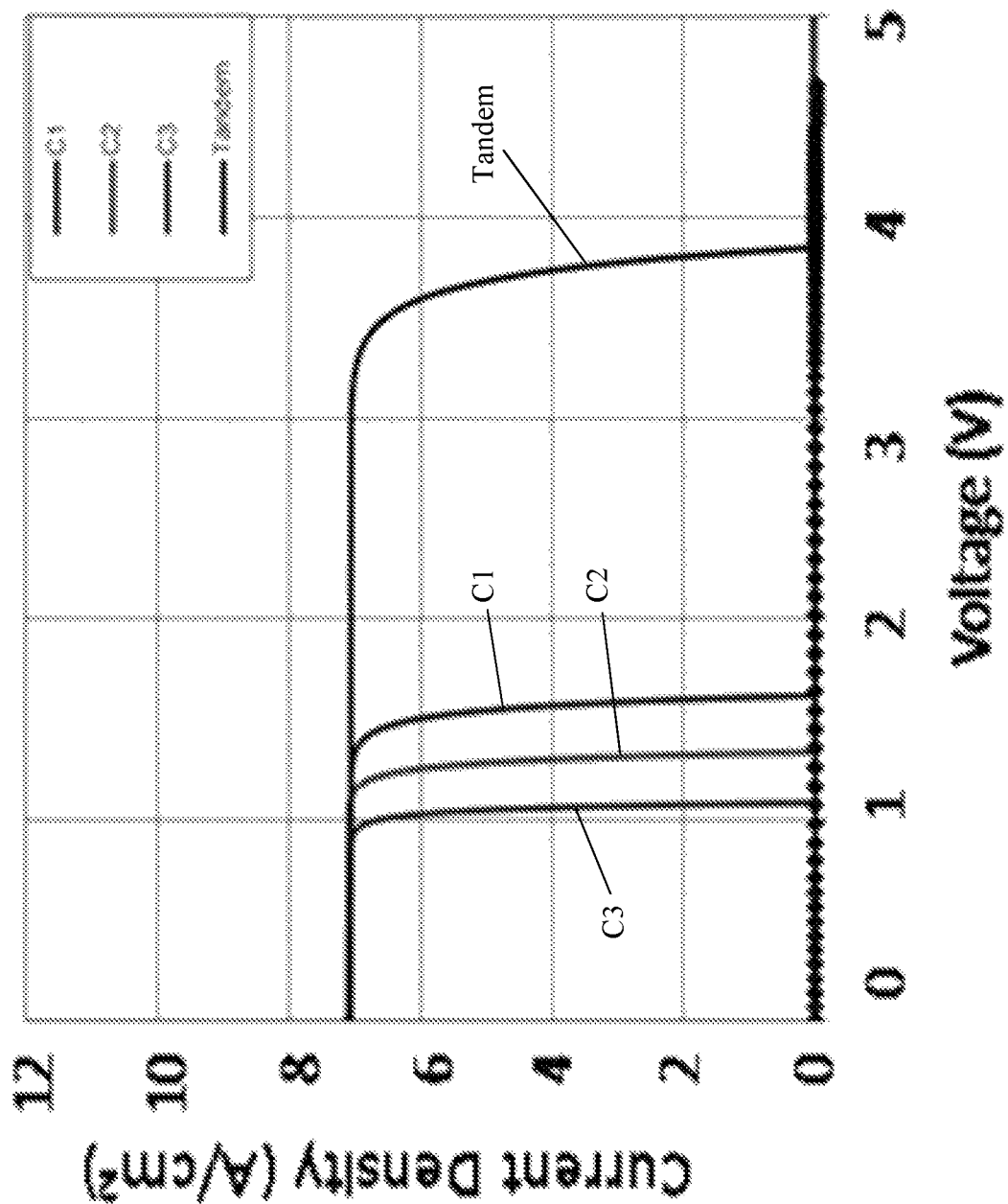
FIG. 8 shows IV performance of individual subcells and the tandem cell.

The calculated IV curves of the tandem solar cell and each subcell are illustrated in FIG. 8. These curves are produced by a detailed device model that incorporates specific design details and feedback from experimental performance. For the data plotted here, the concentration ratio is set to be 500 suns and the cell working temperature is 25° C. The short-circuit current density $J_{sc}$ of the three subcells C1, C2, and C3 are 7.22 A/cm², 7.23 A/cm² and 7.21 A/cm², respectively, with the small separation indicating a good current match between each junction. The $J_{sc}$ of the tandem cell is 7.21 A/cm², while the open-circuit voltage $V_{oc}$ reaches 3.8V, as the sum of the $V_{oc}$ for each subcell. The fill factor (FF) for C1, C2 and C3 is 88%, 86% and 89%, respectively, resulting in a FF of 87% for the whole device.

In order to investigate the performance of the tCPV system, Finite Element Method (FEM) modelling is employed using COMSOL Multiphysics. The model combines ray optics with thermal analysis simultaneously for a robust understanding of the feedback between optical performance and thermal performance. An about 1 m² round parabolic dish is employed as concentrator, with focal length of about 0.68 m and rim angle of about 45 degrees. Corrections for finite source diameter and dish surface roughness are applied to make the simulation more accurate. A maximum disc angle of about 4.8 mrad and surface roughness of about 2.55 mrad is set in the model to compensate for the angular distribution of incoming sunlight and the surface/shape error of the dish, respectively. An empirical power law is applied for the limb darkening model. The total number of rays is set to be $2 \times 10^5$.

Figure 9:
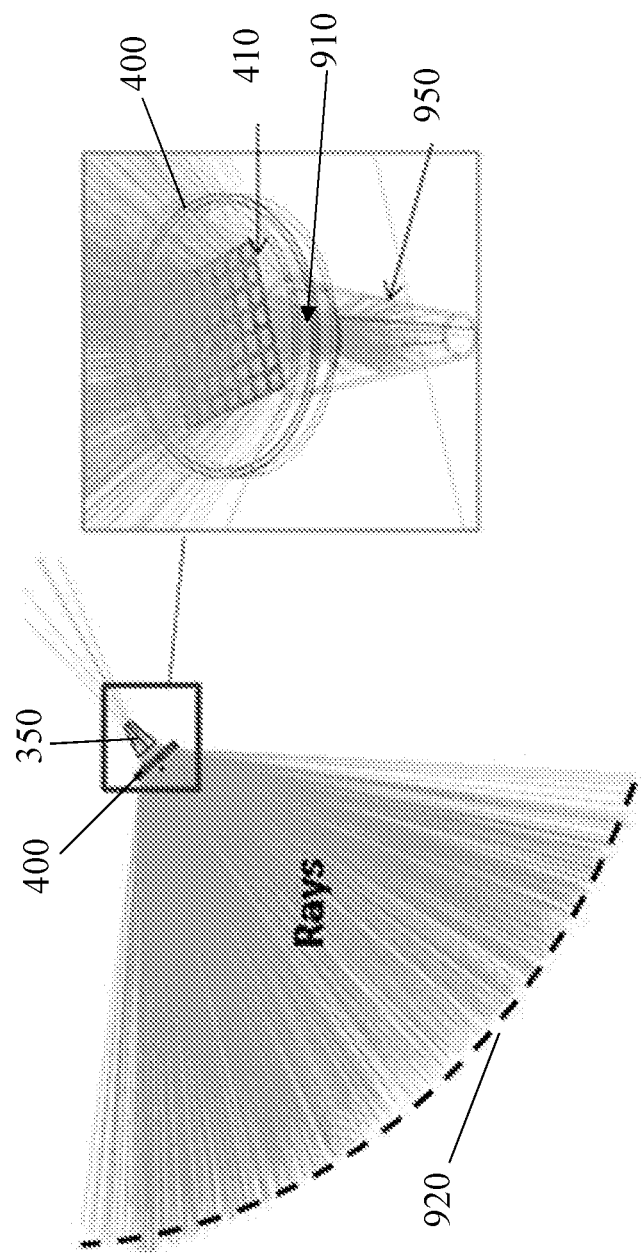
FIG. 9 shows a ray tracing analysis.

In this model, the tCPV module 400 is placed just in front of the thermal receiver 350, and the thermal receiver front opening 910 is placed at the focal point of the dish 920, as shown in FIG. 9. The structure and materials for the tCPV module 400 are set as shown in FIG. 4, while the thermal receiver material is set to be stainless steel with a highly absorbing internal surface such as Pyromark black paint. The optical and thermal properties of all the materials are taken from the relevant literature. The metallic heatsink is not built into this module in order to simplify the calculation; however, the equivalent boundary conditions are applied on the circumference of the aluminum frame using a heat transfer coefficient of 3400 W/K/m$^2$, which is calculated based on the geometry of the heatsink. The remaining surfaces of the tCPV module 400 are set with a heat transfer coefficient of 2 W/K/m$^2$, which is equivalent to an environment with minimal surrounding airflow. Surface to surface radiation is also considered between the tCPV module 400 and the thermal receiver 950, setting the inner surface of the receiver as a diffuse surface with emissivity of 0.87. The ambient temperature is set to be 30° C.

In the tCPV module 400, the optical intensity distribution on individual cells 410 has a high correlation with cell temperature, as the temperature increases as the concentration ratio increases, and both temperature and concentration ratio have an impact on the power conversion efficiency of the solar cells. In particular, due to the transmissive nature of the modeled module design, cell cooling is a particular challenge. Therefore, it is critical to systematically investigate the optical and thermal performance of the module. In this model, the ray optics module and the thermal module in COMSOL are coherently implemented: the absorbed heat energy in each individual cell is obtained from the ray optics module output, which is then used in the thermal module to simulate the thermal performance of the system. Specifically, the heat generated in a tCPV cell is calculated as follows:

$$W_{heat} = W_{absorb} - W_{electricity}$$

Where $W_{absorb}$ is the energy that each cell absorbs. $W_{absorb}$ is calculated as:

$$W_{absorb} = \int_{300\,nm}^{2500\,nm} S_{cell} A(\lambda) D_{AM1.5D}(\lambda) d\lambda$$

where $S_{cell}$ is the cell area, $D_{AM1.5D}(L)$ is the solar power density under the AM1.5 Direct spectrum, and $A(\lambda)$ is the calculated absorbance of the CPV cell derived from the optical properties of each layer, as shown below. $W_{electricity}$ is the output electrical power from the CPV cell, which is defined by:

$$W_{electricity} = \eta_{inband} \int_{300\,nm}^{873\,nm(1.42\,eV)} S_{cell} A(\lambda) D_{AM1.5D}(\lambda) d\lambda$$

Where $\eta_{inband}$ is the modified power conversion efficiency of the CPV cells specifically for in-band light, or light with energy above the bandgap of the bottom subcell C3 (~1.42 eV). Similarly, the out-of-band light is defined as light with energy below this 1.42 eV bandgap.

There are spaces between the CPV cells 410 in the array, as shown in FIG. 4, which allow some of the in-band light to pass through and reach the thermal receiver 350 without being absorbed by the CPV cells 410; this light is referred to as bypass light. The optical bypass ratio (OBP) of the tCPV module 400 is defined to evaluate the fraction of bypass light as:

$$OBP = 1 - \frac{W_{CPV\_inband}}{W_{total\_inband}}$$

Where $W_{CPV\_inband}$ is the total energy of the in-band part of the incident light illuminating the CPV cells 410, and $W_{total\_inband}$ is the total energy of the in-band light incident on the entire module 400. This bypass ratio allows for a tunable dispatchablity fraction in system design, controlling the total fraction of incoming solar energy that is converted and stored as heat. Incorporating OBP into considerations for the tCPV design helps to mitigate cell temperature rise in the CPV module and to leave space for wiring between cells. The transmissive, hybrid nature of the embodiment shown in FIGS. 2 through 6 avoids losses associated with light that misses CPV cells 410, typically a major loss mechanism in conventional dense array CPV module designs.

A transfer matrix style approach was employed to study the reflection, absorption and transmission in each layer. In this approach, the secondary reflection is not taken into account. The equations below were used to calculate the optical parameters. According to Snell's and Fresnel's equation, the reflection between two media that have different dielectric constant $n_1$ and $n_2$ with incident angle $\theta_1$ can be calculated as follows.

$$r_{par} = \tan(\theta_1 - \theta_2)/\tan(\theta_1 + \theta_2)$$

$$r_{ver} = -\sin(\theta_1 - \theta_2)/\sin(\theta_1 + \theta_2)$$

$$r_{tot} = (r_{par}^2 + r_{ver}^2)/2$$

$$n_1 \sin\theta_1 = n_2 \sin\theta_2$$

The transmission may be calculated as follows.

$$T_{tot} = (1 - r_{tot}) \times e^{-\alpha d}$$

$$\alpha = \frac{2\pi k}{\lambda}$$

$$d = d_2/\cos\theta_2$$

The absorption may be calculated as follows.

$$A = 1 - r_{tot} - T_{tot}$$

Figures 10A, 10B:
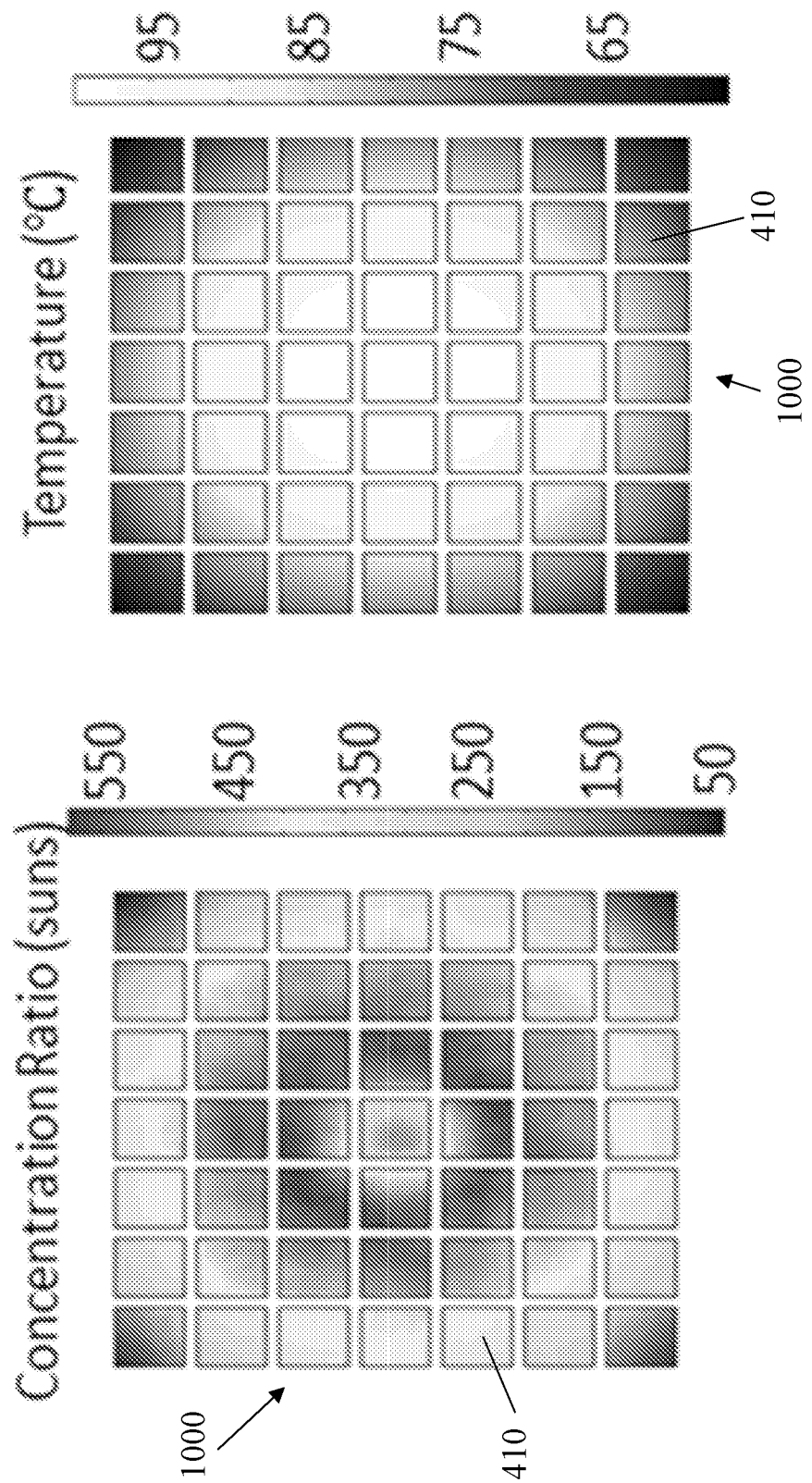
FIG. 10a shows intensity distribution in suns.
FIG. 10b shows temperature in ° C. from a tCPV FEM model.

The modeled concentration ratio and related temperature distribution on the CPV cell arrays 410 are illustrated in FIGS. 10a and 10b. The concentration ratio on the cells 410 varies from ~50 suns to ~580 suns, with an average of about 380 suns, while the temperature ranges from ~60° C. to ~100° C. with an average of about 82° C. The OBP for this model is about 43%. The concentration profile is close to a Gaussian distribution, decreasing from center to edge with minor deviations from a Gaussian distribution due to the surface roughness and shape error of the dish. The temperature of the CPV cells 410 has a similarly shaped distribution. The cell at the center of the array 1000 shows much lower irradiance because of the shadowing on the dish from the module itself.

Figure 11:
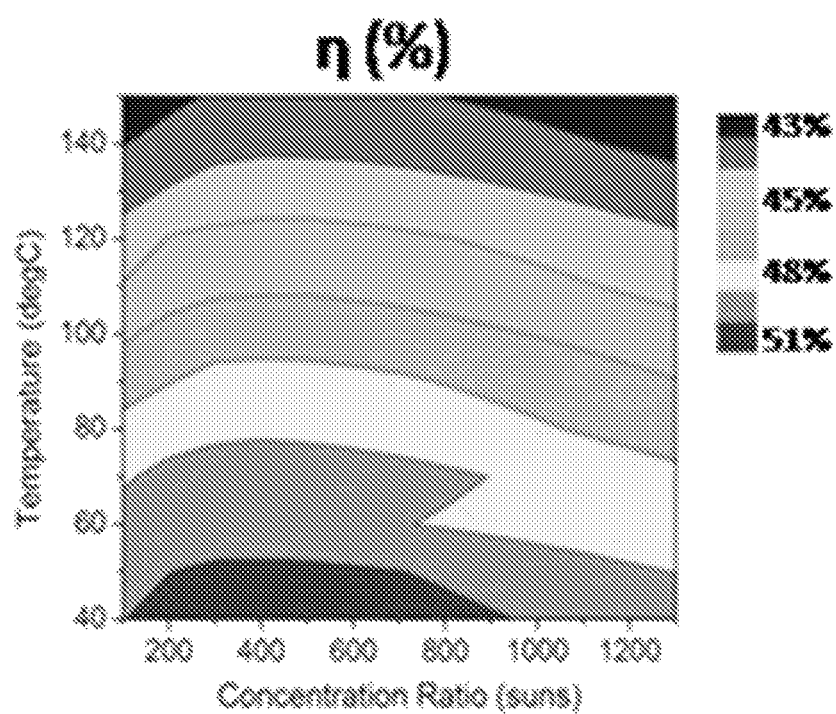
FIG. 11 shows cell in-band efficiency vs. temperature and concentration ratio.
Figure 19:
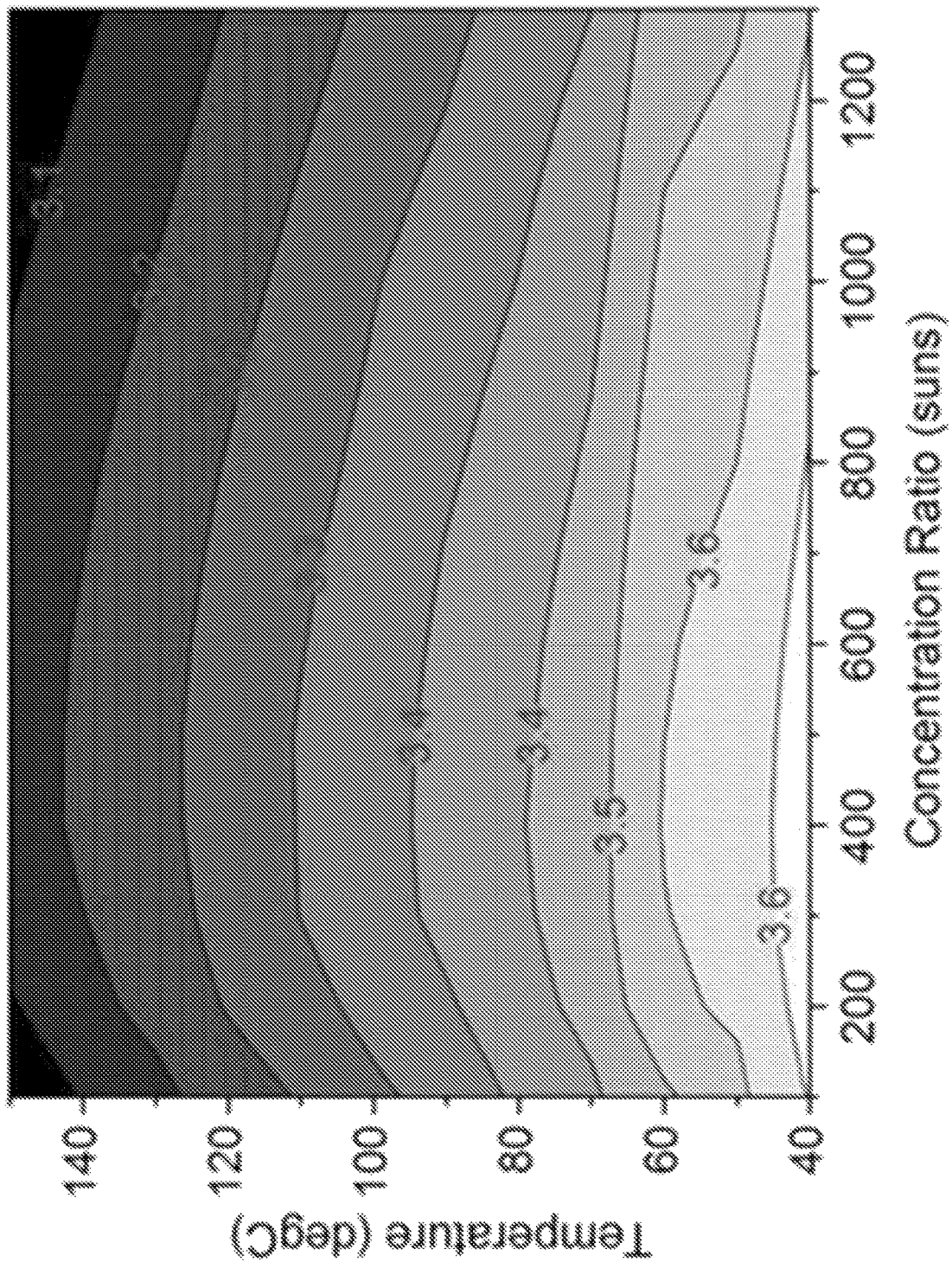
FIGS. 19 and 20 show the $V_{max}$ and $I_{max}$ of the CPV cell at different concentration ratios and temperatures.
Figure 20:
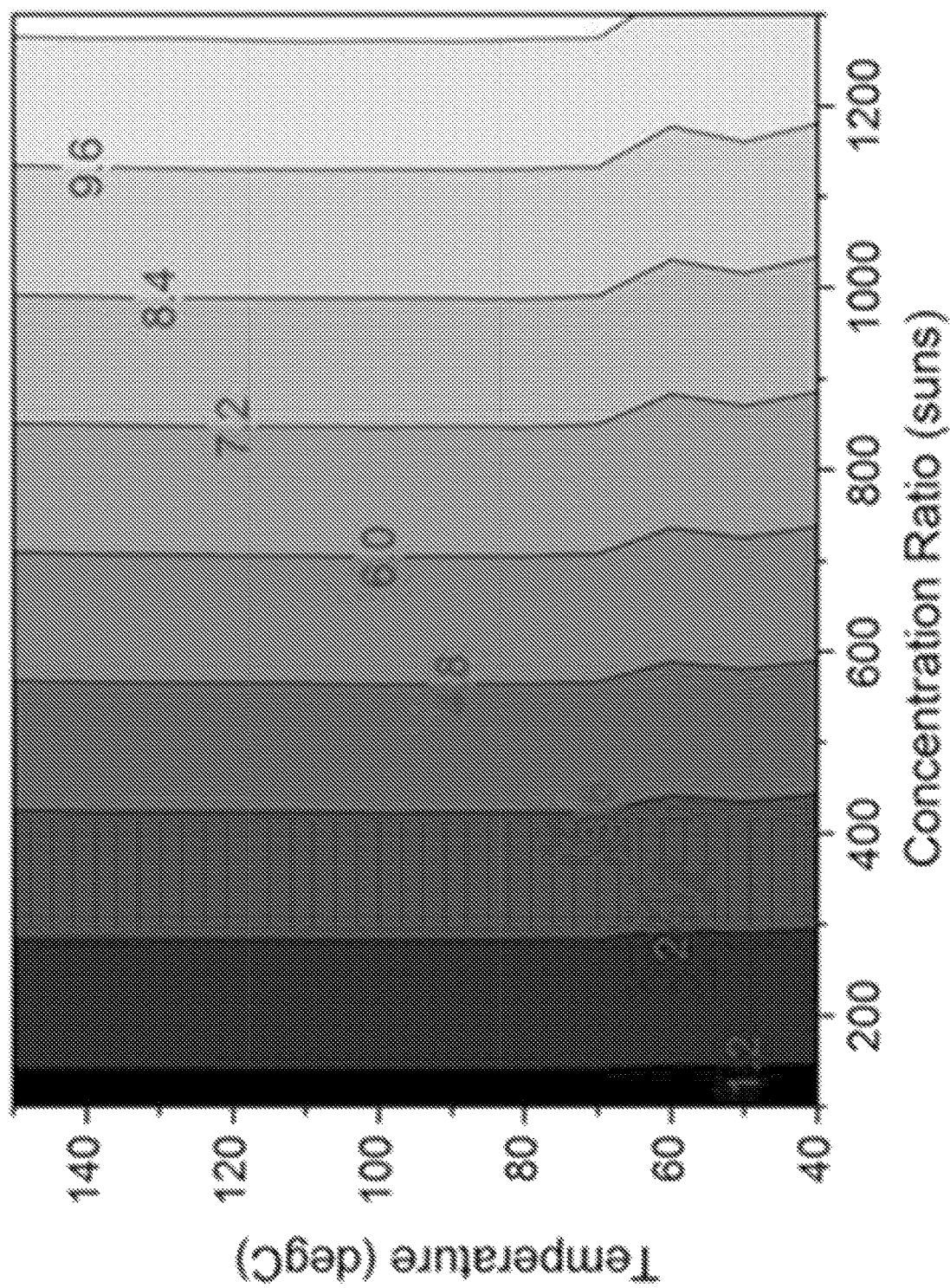

As the irradiance intensity increases, the photocurrent of the CPV 400 increases due to the greater number of absorbed photons, but the higher temperature reduces the output voltage as the bandgap decreases, as shown in FIGS. 19 and 20. The design of this embodiment of the tCPV module takes into account the effect of variable illumination intensity and temperature on CPV performance. A plot of calculated power conversion efficiency of individual CPV cells 410 at different concentration ratios and temperatures is shown in FIG. 11. Given a constant concentration ratio, the increase in temperature from 40° C. to 140° C. causes the CPV efficiency to gradually decrease, leading to a corresponding decrease of voltage output, as shown in FIGS. 19 and 20.

Conversely, as the concentration ratio increases from about 100 suns to about 1300 suns for a given constant temperature, the efficiency increases to a maximum then decreases, showing that the optimized concentration ratio for this embodiment is around 300-500 suns for maximum efficiency. This pattern indicates that although the photocurrent is increasing nearly linearly as the concentration ratio increases, the electrical loss due to the electrode resistance and series resistance of the cell is increasing as a function of the square of the photocurrent. Thus, for higher concentration ratios, the electrical loss becomes large enough to hamper performance, resulting in a reduction in power conversion efficiency. Even if CPV cells 410 are carefully designed for higher concentrations such as about 800 suns, a similar trend results, with optimized efficiency remaining at about 400-500 suns, due to existing resistance in the cells that cannot be further reduced.

Figure 12:
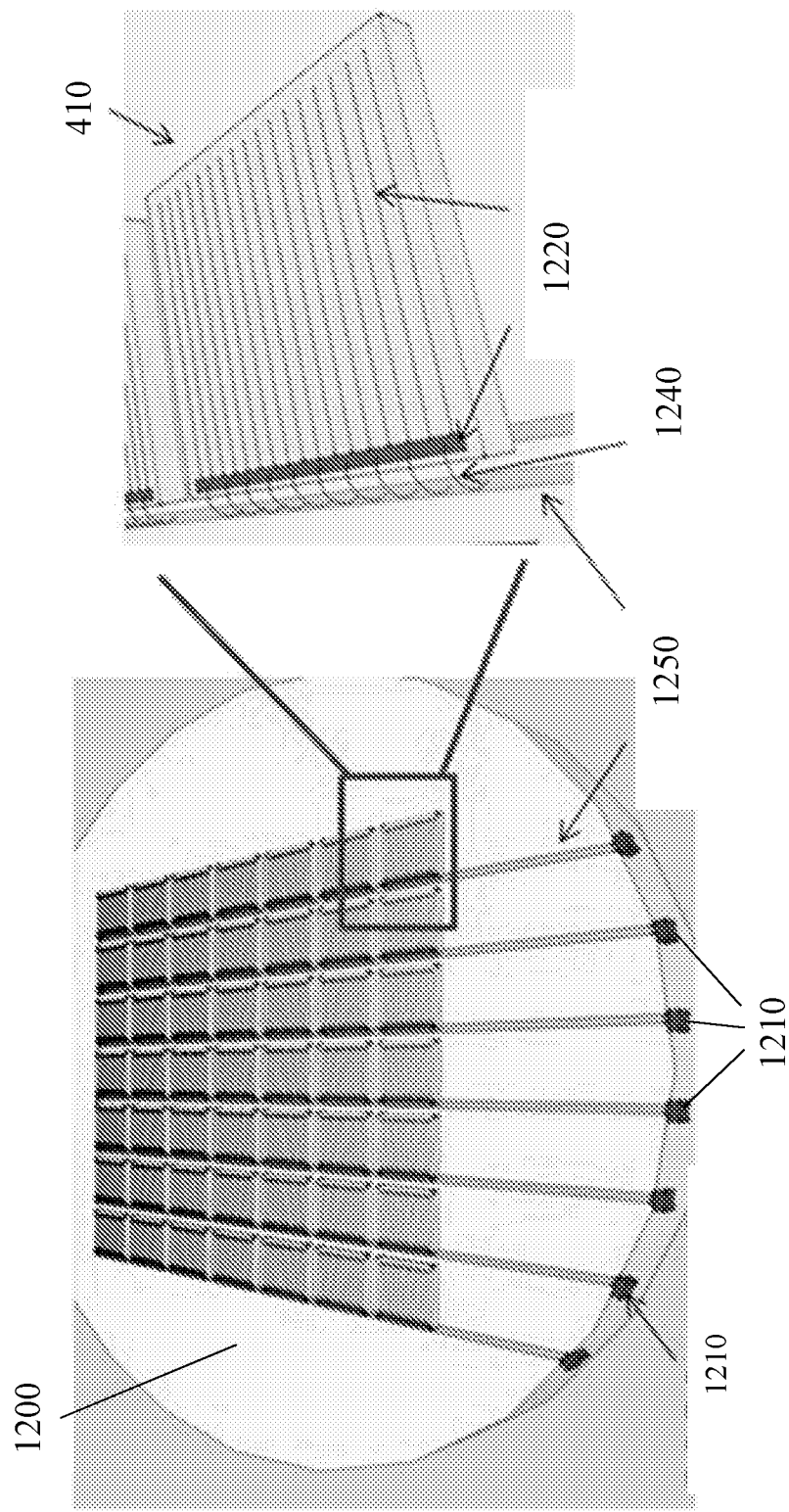
FIG. 12 shows one embodiment of a cell array using an all-in-parallel cell interconnection method.

Given that the $J_{sc}$ of the CPV cells 410 is highly variable with an about 300% change between the highest cell and the lowest cell due to the non-uniform intensity distribution as seen in FIGS. 10, 20 and 20, while the variability of $V_{oc}$ is much smaller at about 1%, a non-conventional method may be used to connect the CPV cells 410. All cells 410 may be wired in parallel or in series/parallel combinations instead of in series, taking advantage of the low variability in voltage to reduce electrical mismatch losses when interconnecting cells, as shown in FIG. 12. This makes use of the intensity and temperature distribution where cells with higher illumination have higher voltage, offsetting the corresponding decrease in voltage resulting from higher cell temperature and vice versa.

The 49-cell array 1200 may be set in 7 groups by rows, and each row of 7 cells may be electrically wired in parallel. Each row may be connected to a 3V-to-12V DC-DC convertor 1210. The outputs of 7 DC-DC convertors may then be connected in parallel and linked to a 12V-to-110V DC-AC inverter (not shown) to connect the output power to the grid. An all-in-parallel cell interconnection method may reduce electrical losses due to current mismatch between cells resulting from non-uniform illumination, and it may minimize power losses that occur when focal spot wandering happens, as shown in FIGS. 21a through 21c and FIG. 22. This cell interconnection approach is shown in FIG. 12. Interconnects may be deposited on the bottom substrate, and the back electrode 1220 of the cell may be mounted to the copper by indium bonding, while the top electrode 1230 may be connected to the other interconnect 1250 by wire bonding 1240. The module 400 may then be filled with encapsulant for sealing. In some embodiments, the interconnections 1250 may be copper. In some embodiments, the encapsulant may be a silicone encapsulant.

Figure 21:
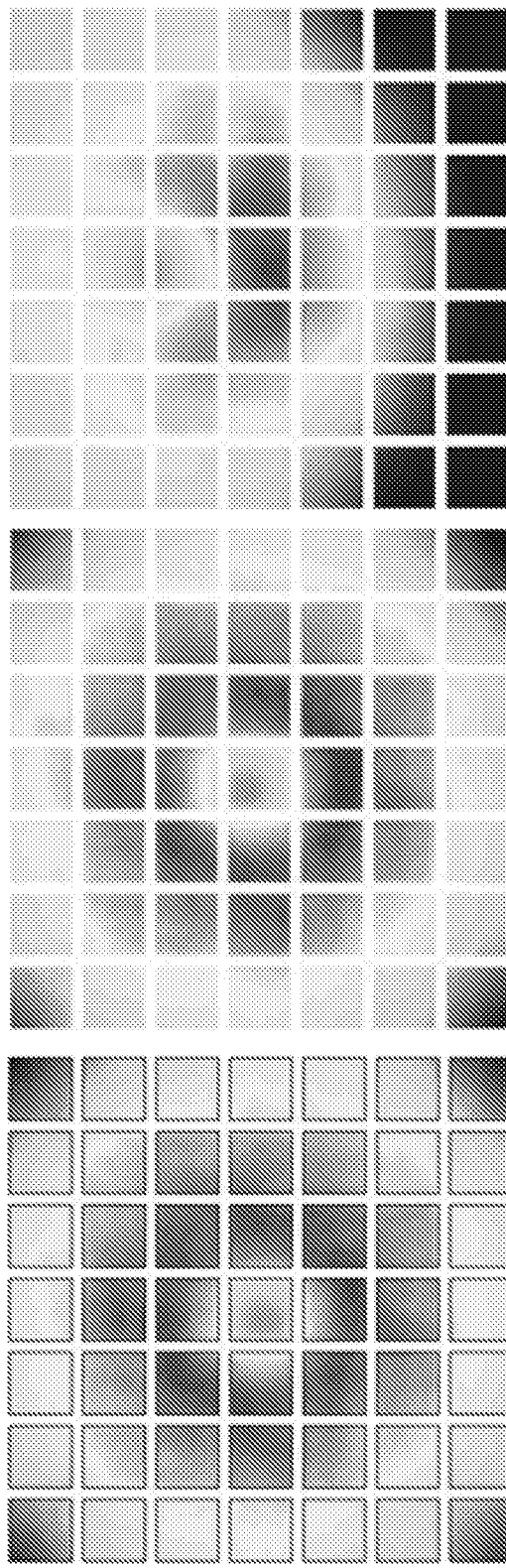
FIGS. 21a, 21b, and 21c show spot wandering simulations and the resulting intensity distribution on the tCPV cell array with tracking error of 0 degrees, 0.1 degree, and 1 degree
Figure 22:
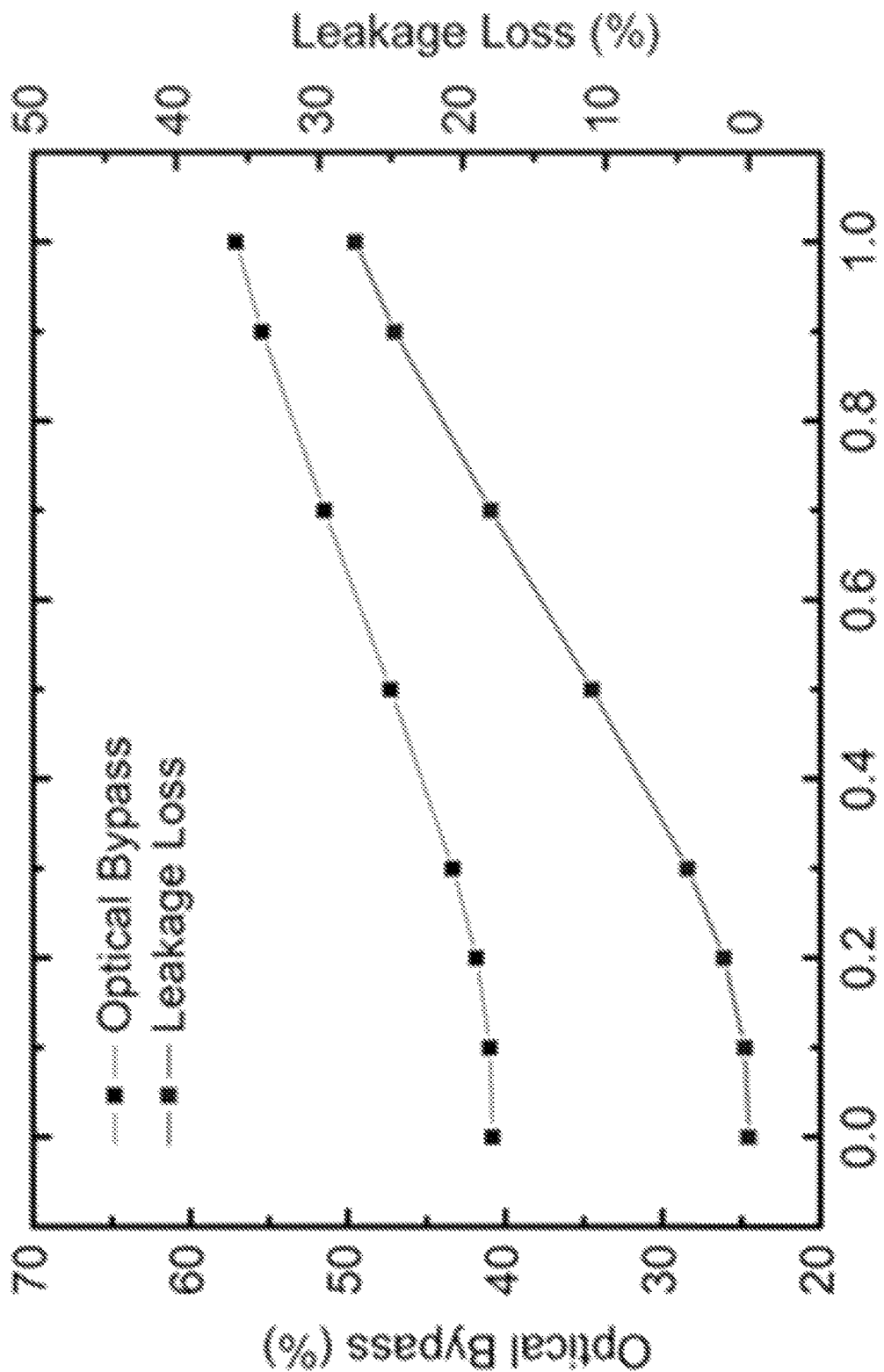
FIG. 22 shows optical bypass and leakage loss at different tracking errors from 0 degree to 1 degree.

Spot wandering exists in all solar tracking systems. The tracking error typically varies from about 0.1 degree to about 1 degree, depending on the quality and the accuracy of the tracker and the environmental conditions. Tracking errors cause drift of the light spot on the tCPV array, as shown in FIGS. 21a, 21b, and 21c, which show the intensity distribution of light on the tCPV cells 410 for tracking errors of about 0 degrees, about 0.1 degrees, and about 1 degrees, respectively. For severe spot wandering of about 1 degree, a certain number of the PV cells 410 are not illuminated, leading to energy losses from the non-aligned light leaking from the module. This "leakage" loss increases with the tracking error, as shown in FIG. 22. The OBP also increases due to less light focusing onto the PV cells 410.

Figure 13:
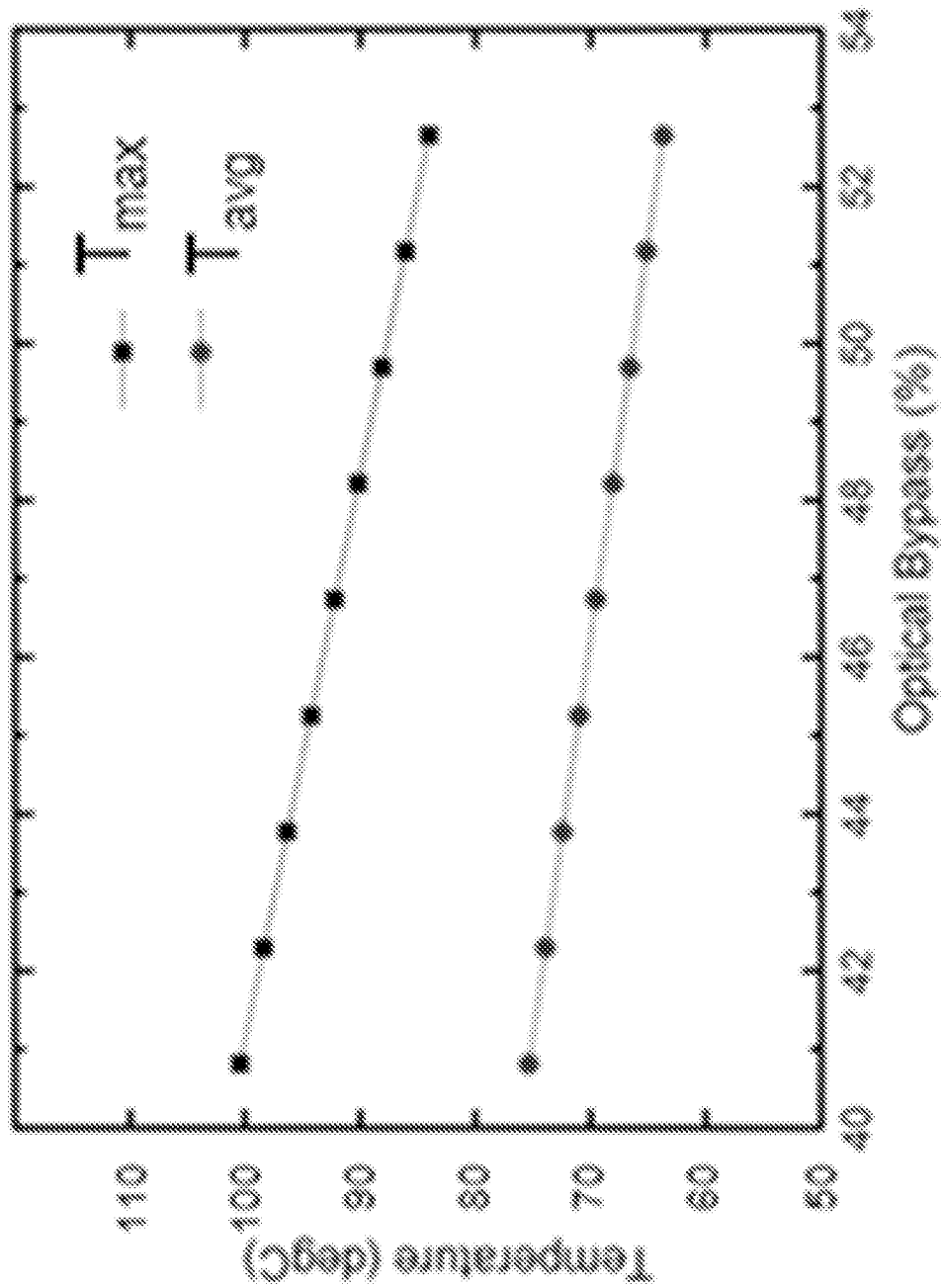
FIG. 13 shows a plot of bypass vs temperature.

Because the performance of the CPV module 400 decreases at high cell temperature operation, it is critical to implement cooling methods that ensure that the system maintains an acceptable temperature. In some embodiments, the tCPV module 400 utilizes highly transparent cooling methods. The maximum cell temperature is dependent on various parameters. High OBP results in relatively lower cell temperatures because less energy is absorbed by the CPV cells 410, as shown in FIG. 13. As the OBP increases from about 41% to about 51%, the maximum module and cell temperature decreases by about 15° C. from about 102° C. to about 87° C., and the average cell temperature drops by about 9° C. from 76° C. to 67° C.

Figure 14:
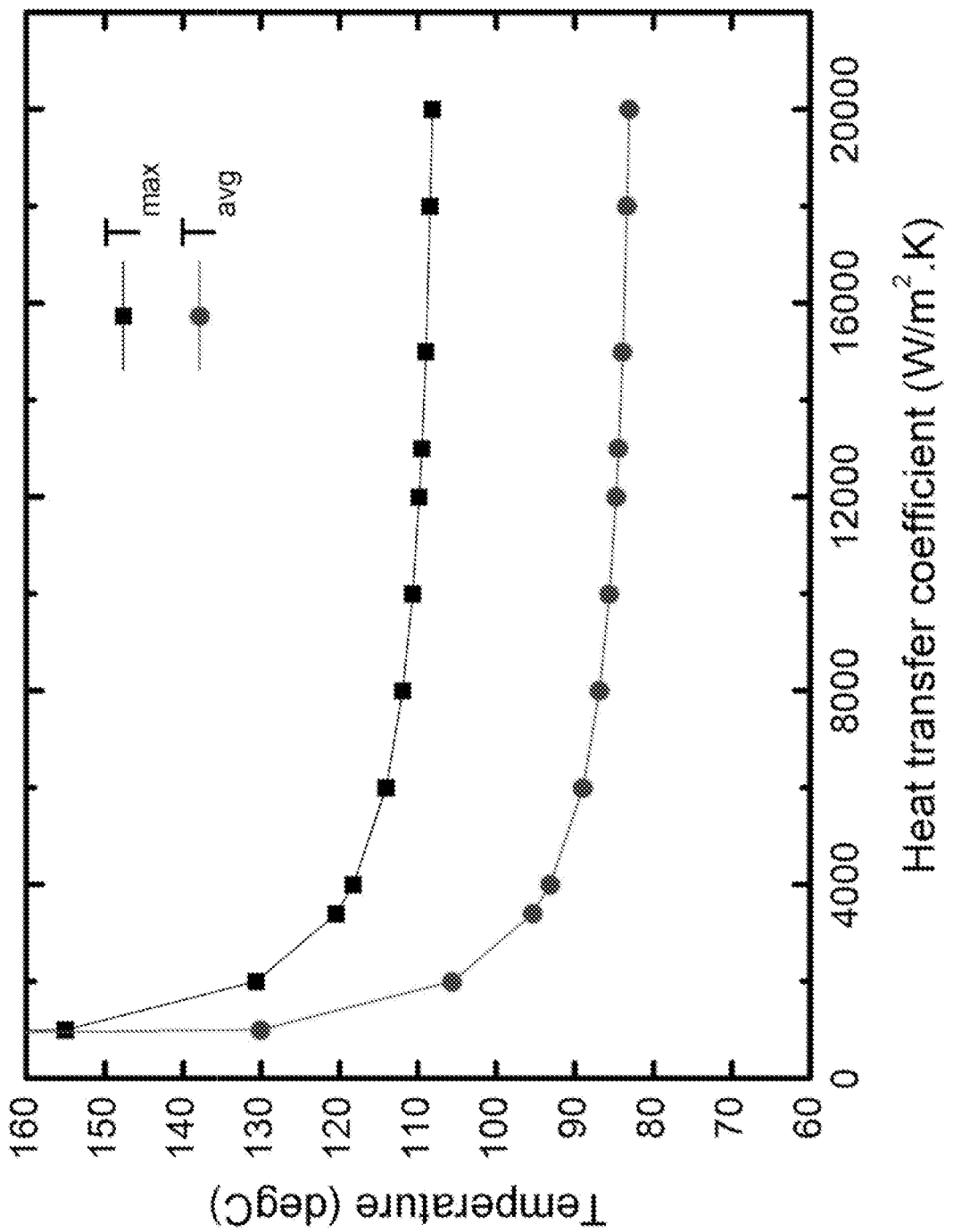
FIG. 14 shows a plot of heat transfer vs temperature—passive cooling limit.

Improving the cooling performance of the heat sink also reduces the system temperature. FIG. 14 shows the relationship between the maximum/average cell temperature and the equivalent heat transfer coefficient of the heat sink $h_{eq}$. The maximum cell temperature decreases when $h_{eq}$ increases, which may be realized by changing the geometry and materials of the heat sink. When $h_{eq}$ increases up to 10,000 W/m$^2$/K, the system temperature no longer sharply decreases, but changes only slightly, with maximum temperatures of about 92° C. and average cell temperature of about 61° C. At high values of $h_{eq}$, the thermal conductivity of the encapsulant and the sapphire become the dominant limitations to heat transfer.

Figure 15:
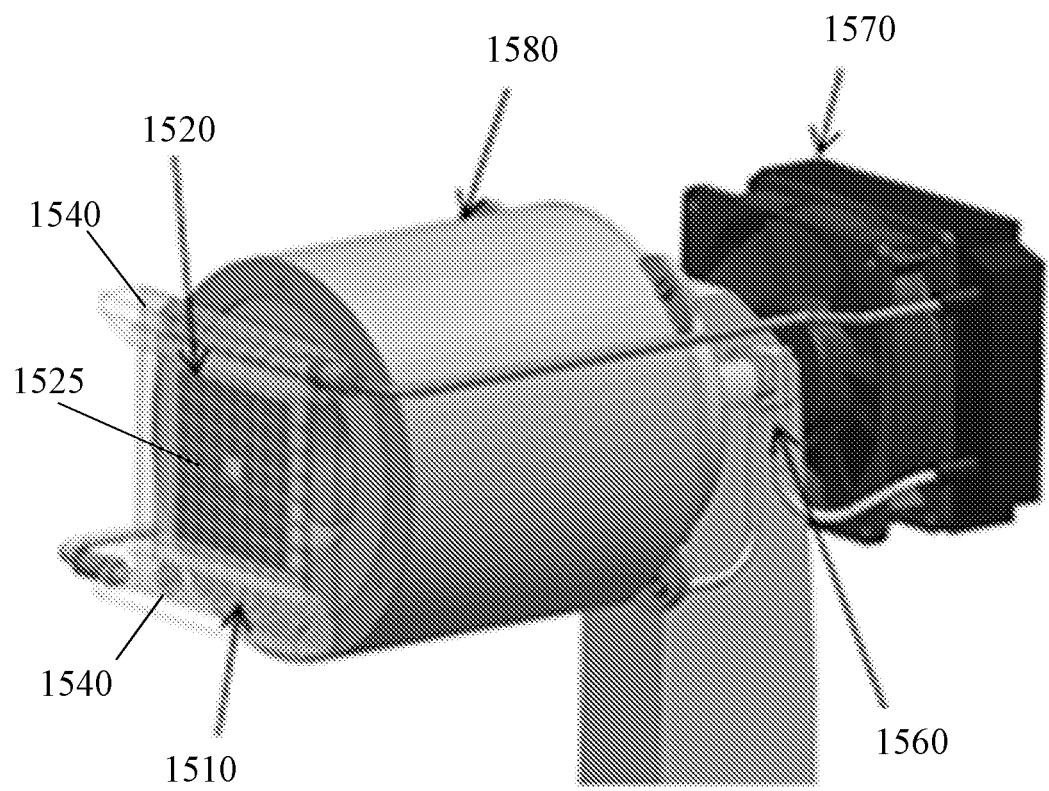
FIG. 15 shows one embodiment of an active cooling system.
Figure 23A:
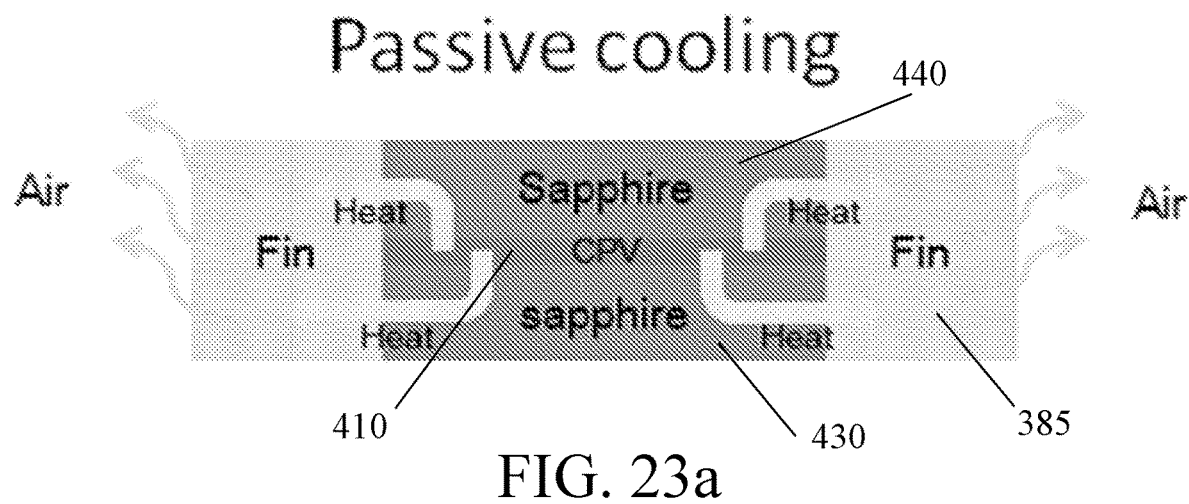
FIG. 23a shows a schematic representation of the heat flow through the module in a passive arrangement.
Figure 23B:
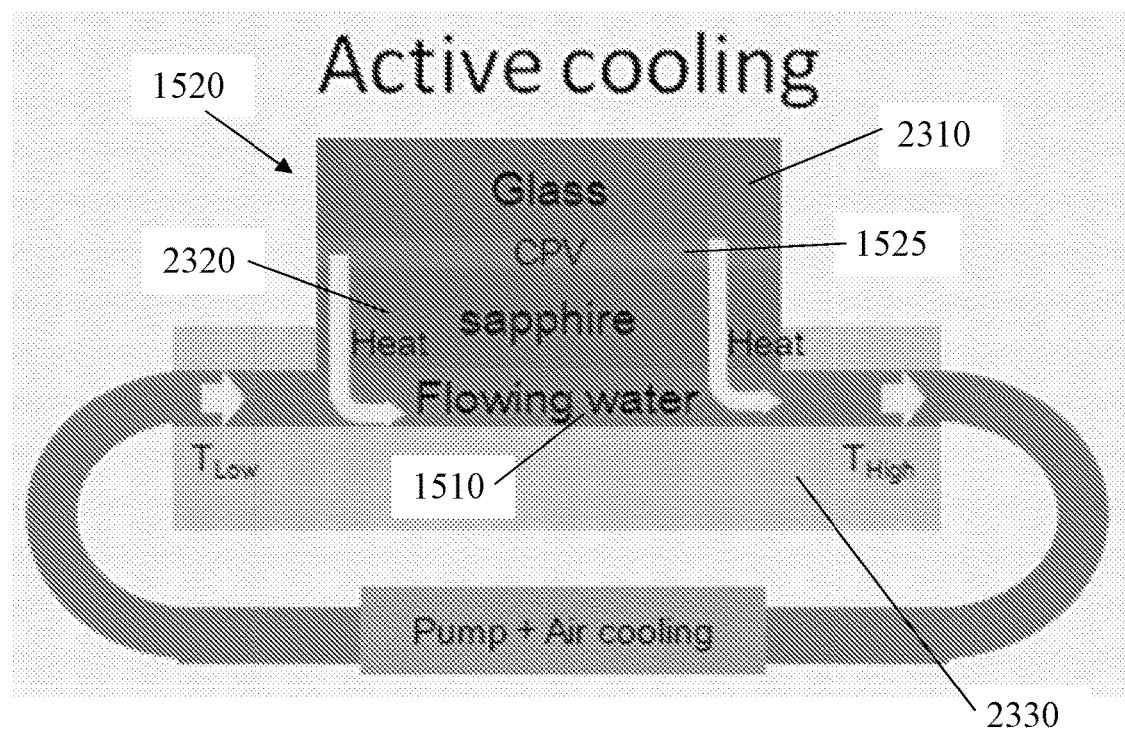
FIG. 23b shows a schematic representation of the heat flow through the module in an active arrangement.

Possible approaches to obtaining lower peak module temperatures include improving the performance of the heat sink and increasing the thickness of the top/bottom superstrate/substrate layers, but these methods result in significant increases in module cost. Another approach is to use active cooling systems instead of or in addition to passive cooling systems. FIG. 15 shows a 3D model for one embodiment of the tCPV module that uses an active cooling system. Heat is conducted into a heat transfer fluid which flows under the cells, as shown in FIG. 23b. Seven micro-channels 1510 may be located at the back of the CPV module 1520, using water as the coolant. The dimensions of each channel 1510 may be about 5.5 mm wide by about 100 μm thick by about 6 cm long. The cells 1525 may be sandwiched between a top glass layer 2310 and a bottom sapphire layer 2320. The channels 1510 (also called microfluidic channels) may be etched into a glass layer 2330 (which may serve as a transmissive base upon which the CPV module 1520 is mounted) located below the sapphire layer 2320 and the channels 1510 may be aligned underneath the cells 1525. Two manifolds 1540 at the sides of the module 1520 guide cooling fluid into and out of the channels 1510. A small pump 1560 may be placed behind the thermal receiver 1580 to keep the coolant flowing, and a forced-air radiator 1570 may be used to reduce the coolant temperature. The pump 1560 and the radiator 1570 may be powered by the CPV system itself.

Figure 28B:
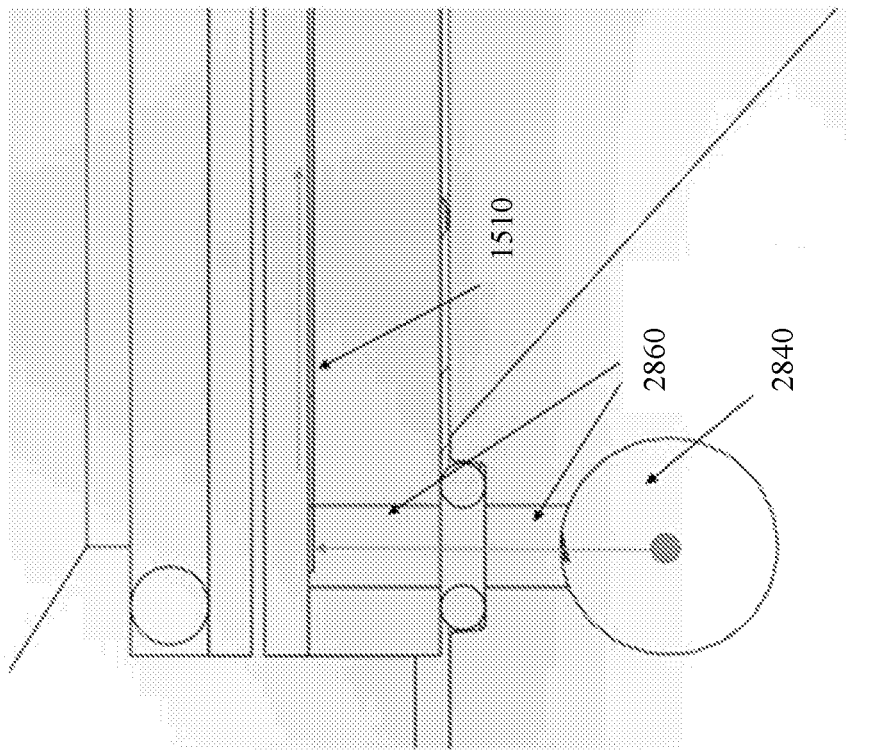
FIG. 28b shows a cross section A-A (in FIG. 28a) of the flow path.
Figure 28A:
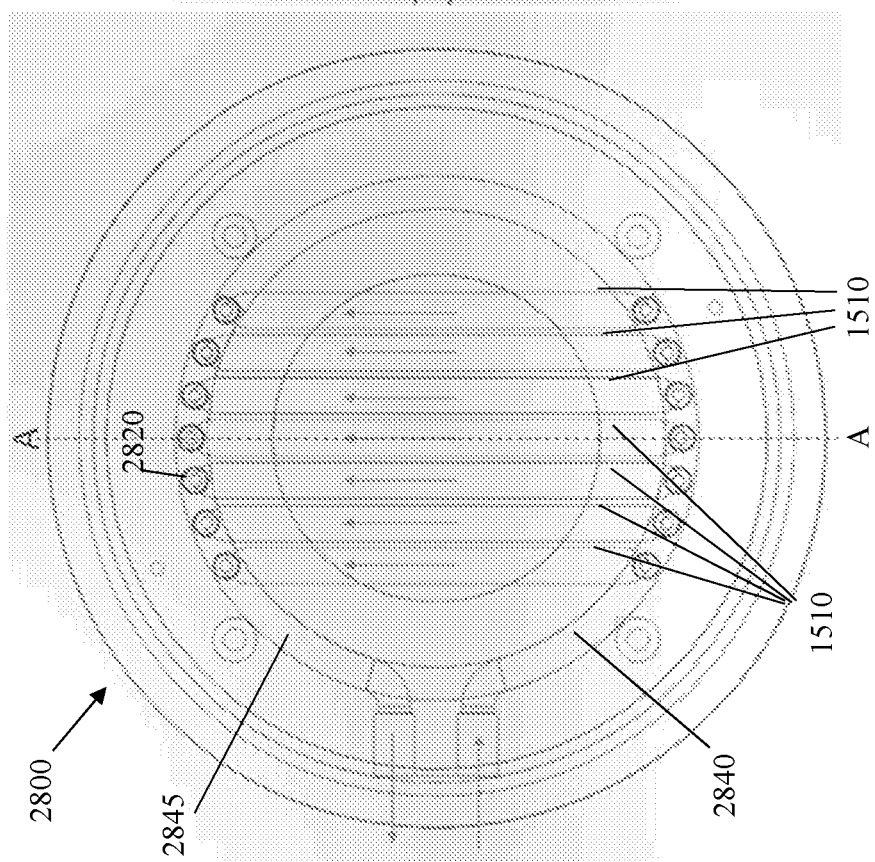
FIG. 28a shows the flow path of heat transfer fluid through the active cooling module.
Figure 29:
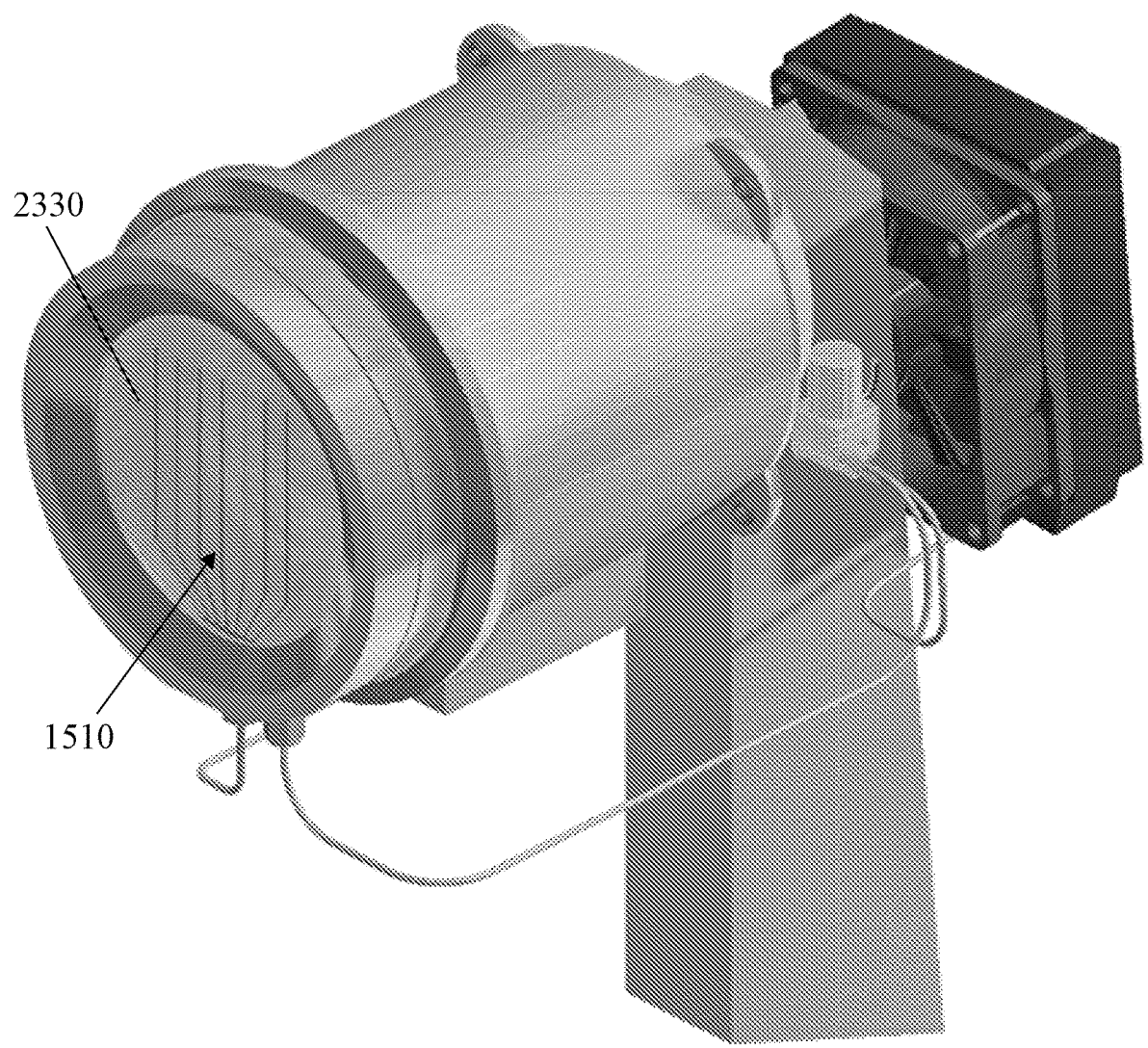
FIG. 29 shows an embodiment of an active cooling system with the microfluidic channel plate visible.

FIG. 29 shows the apparatus of FIG. 15 without CPV module 1520, thereby showing the micro-channel backplate (e.g., glass layer 2330). FIGS. 28a and 28b (FIG. 28b shows a partial cross section A-A of module 2800) show the flow path of heat transfer fluid through an embodiment of an active cooling module 2800. Specifically, fluid flows through manifold 1540, up feedline 2860, across channels 1510 (which each runs underneath a respective row of photovoltaic cells 1525), out of a corresponding bleedline 2820, and back out an outgoing manifold 2840.

Figure 16:
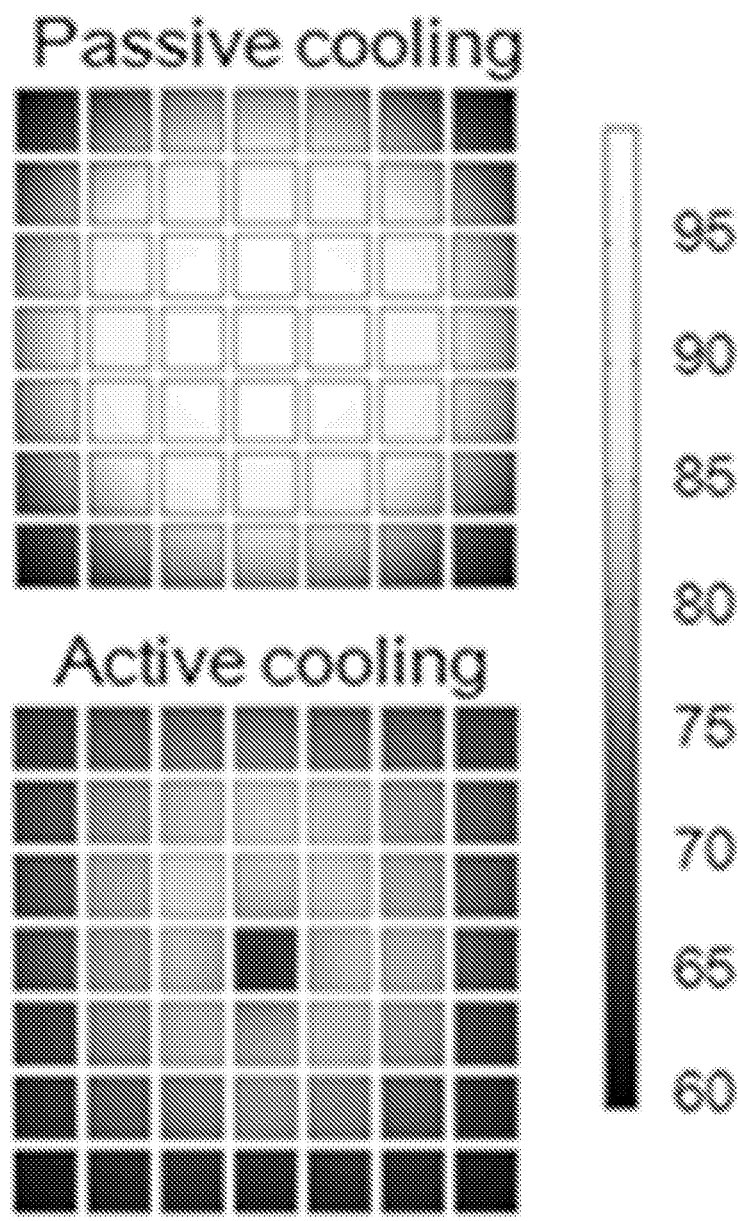
FIG. 16 shows temperature distributions for passive cooling and active cooling.
Figure 17:
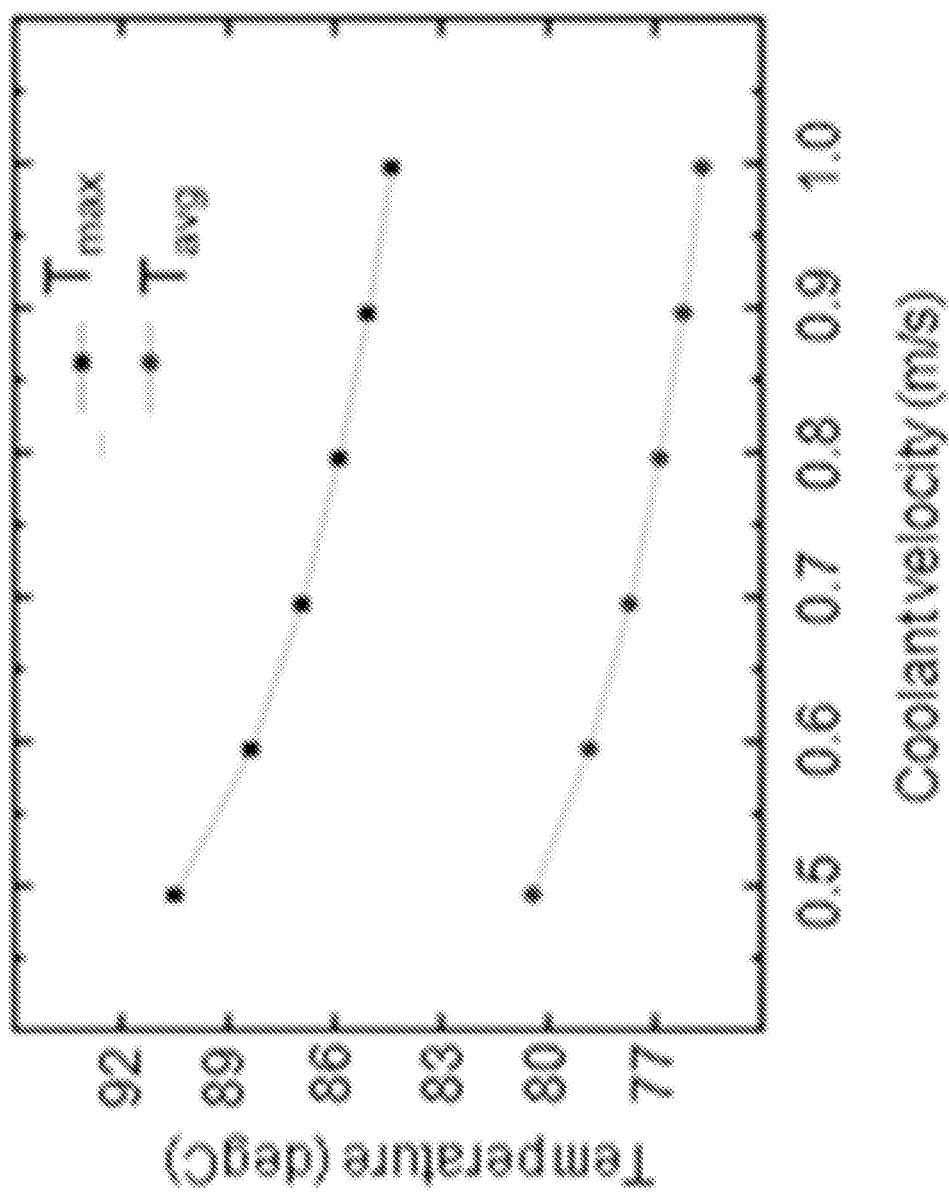
FIG. 17 shows active cooling performance vs coolant velocity.

Compared to passive cooling systems, the active cooling system used in this embodiment further decreases the module temperature and improves its performance accordingly. FIG. 16 shows a comparison of the temperature distribution on the tCPV array using a passive cooling method and an active cooling method. The active cooling method allows the system to perform at a much lower temperature than passive cooling, resulting in a maximum temperature of about 86° C. and an average temperature of about 75° C. The temperature distribution is more uniform for the cells at the corners as the coolant flows and extracts heat more uniformly along the row. The performance of active cooling may be adjusted by changing the flow velocity of the coolant. By changing the pressure of the pump 1560, the velocity of the coolant is varied, resulting in different module temperatures as shown in FIG. 17. The maximum module temperature drops from 91° C. to 84° C. as the mean velocity of the coolant increases from 0.5 m/s to 1 m/s, with the same trend in the average temperature. The data show that either passive or active cooling systems may be implemented within the tCPV system with high transparency and cooling performance. Peak module temperature is demonstrably decreased with the active cooling approach.

Table 1 summarizes the calculated performance of one embodiment of the tCPV module. Different types of losses are listed, including optical losses due to anti-reflection coatings (ARC) in the module and electrical losses such as wiring resistance loss, circuit mismatch loss, and losses in the DC-DC converters. A current/voltage output of 12.68 A/12V for passive cooling or 12.94 A/12V for active cooling is obtained for the module, leading to a total power output of 152.16 W for passive cooling and 155.28 W for active cooling, for a concentrating dish aperture area of about 1 m$^2$. The calculated overall efficiency of the tCPV module shows that the in-band efficiency $\eta_{inbound}$ and is about 42.65% with a passive cooling system and about 43.53% with an active cooling system.

TABLE 1

Photovoltaic performance of the tCPV module

| Optical loss | | |
|---|---|---|
| ARC | 3% | |
| Electrical loss | | |
| Wiring | 1% | |
| Mismatch | 0.5% | |
| DC-DC | 7% | |
| | Passive cooling | Active cooling |
| Output Current | 12.68 A | 12.94 A |
| Output Voltage | 12 V | 12 V |
| Output Power | 152.16 W | 155.28 W |
| Cell Efficiency (Avg) | 48% | 49% |
| Module Efficiency | 42.65% | 43.53% |

A passive cooling strategy has several advantages over an active cooling system, including enhanced reliability for applications with a long lifetime, i.e. 30 years or more, and without parasitic power demands. On the other hand, active cooling systems have better cooling performance and considerably reduce the module cost to improve the performance cost-ratio of the module. In the embodiment of FIGS. 15 and 23, most of the heat is conducted from the tCPV cells 1525 to the coolant through a thin bottom sapphire layer 2320 in the active cooling system, allowing the top sapphire substrate to be replaced by traditional glass 2310 and the thickness of the bottom sapphire 2320 to be reduced from 5 mm to 1 mm or less, which reduces the usage of costly sapphire materials.

Figure 18:
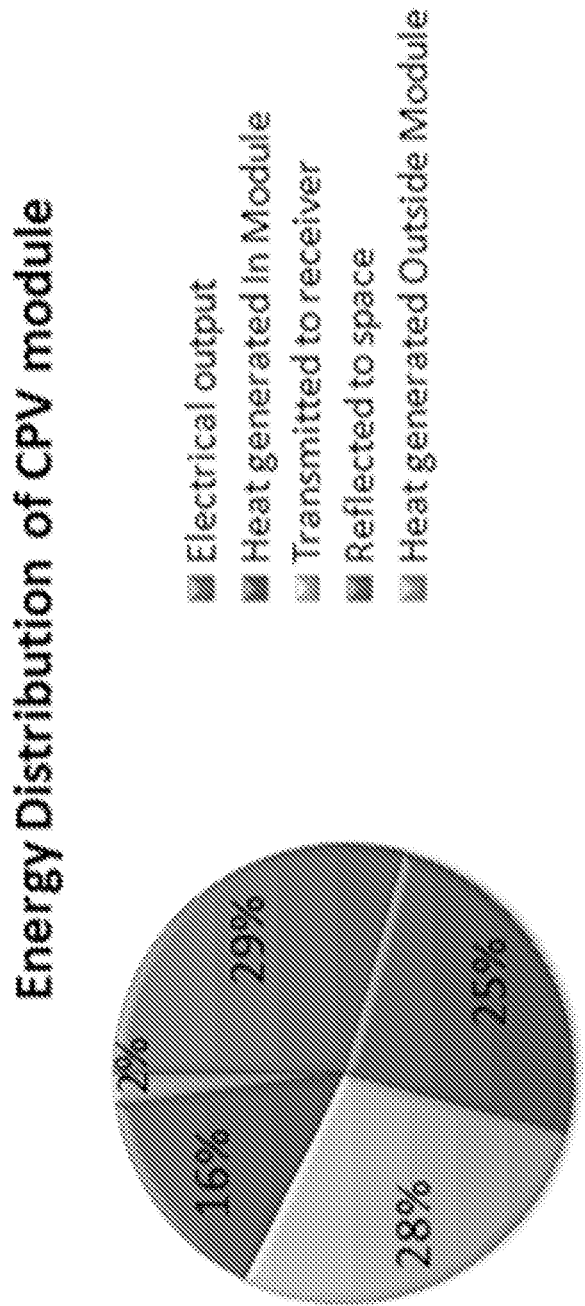
FIG. 18 shows energy distribution in one embodiment of a tCPV module.

In order to evaluate the effectiveness of energy generation in this embodiment of the tCPV module, the resulting energy distribution of the incident radiation energy in the tCPV module was calculated, as shown in FIG. 18. About 29% of the incident radiation energy was converted to electricity output through the module. For the rest, nearly 28% is transmitted to the thermal receiver, and nearly 25% of the original energy is converted to heat in the module, which are the main losses. Other losses include about 16% of incident light lost as optical reflection and about 2% heat generation outside the module. The heat losses may be due to the heat generation in the PV cells and in the encapsulant and to the electrical resistance of all the electrodes and wires.

The embodiment of a tCPV module discussed in this example may not be limited to one particular PV/T system. It may be used or adapted for other spectrum splitting hybrid systems with or without thermal storage. The parameters of the module may easily be adjusted, including bandgap selection, optical bypass ratio, and others to meet various requirement of different systems. The tCPV module may be widely utilized for solar energy conversion applications on both community and industrial scales.

A transmissive, concentrating photovoltaic (tCPV) module may be able to realize full-spectrum utilization of sunlight in a hybrid photovoltaic and solar thermal (PV/T) system. Finite Elemental Method (FEM) based numerical analysis and other modeling techniques show that in one embodiment, a tCPV module may have an overall power conversion efficiency of about 43.5% for in-band light under a standard AM1.5D solar spectrum. Active and passive cooling systems that are highly transparent to infrared light may be used to increase the efficiency of the tCPV hybrid PV/T system.

Figure 25:
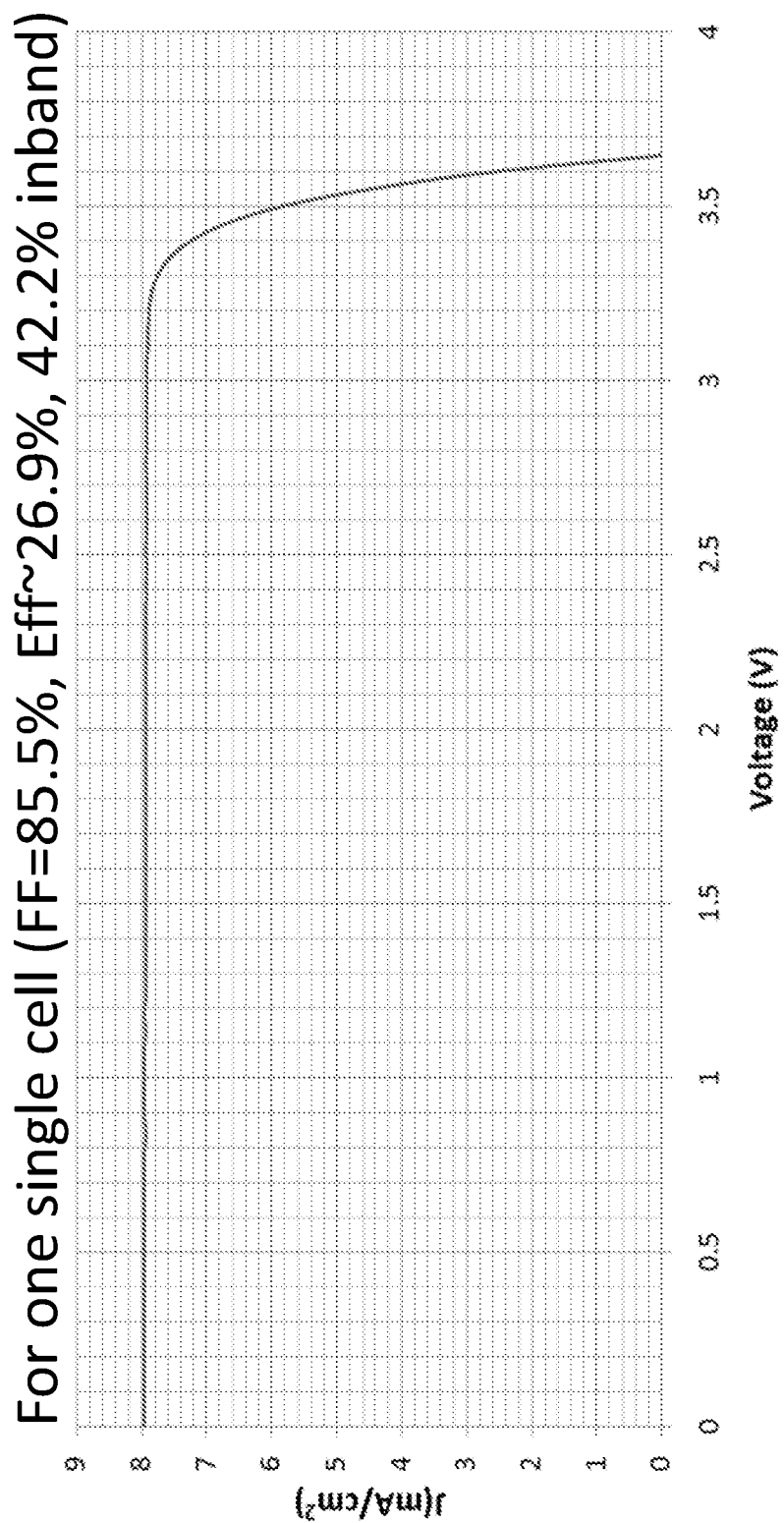
FIGS. 25 and 26 show preliminary data (I-V curves) for a single photovoltaic cell and two cells, respectively, assembled into a tCPV module configuration including top and bottom windows, encapsulant, photovoltaic cells, and electrical connections.
Figure 26:
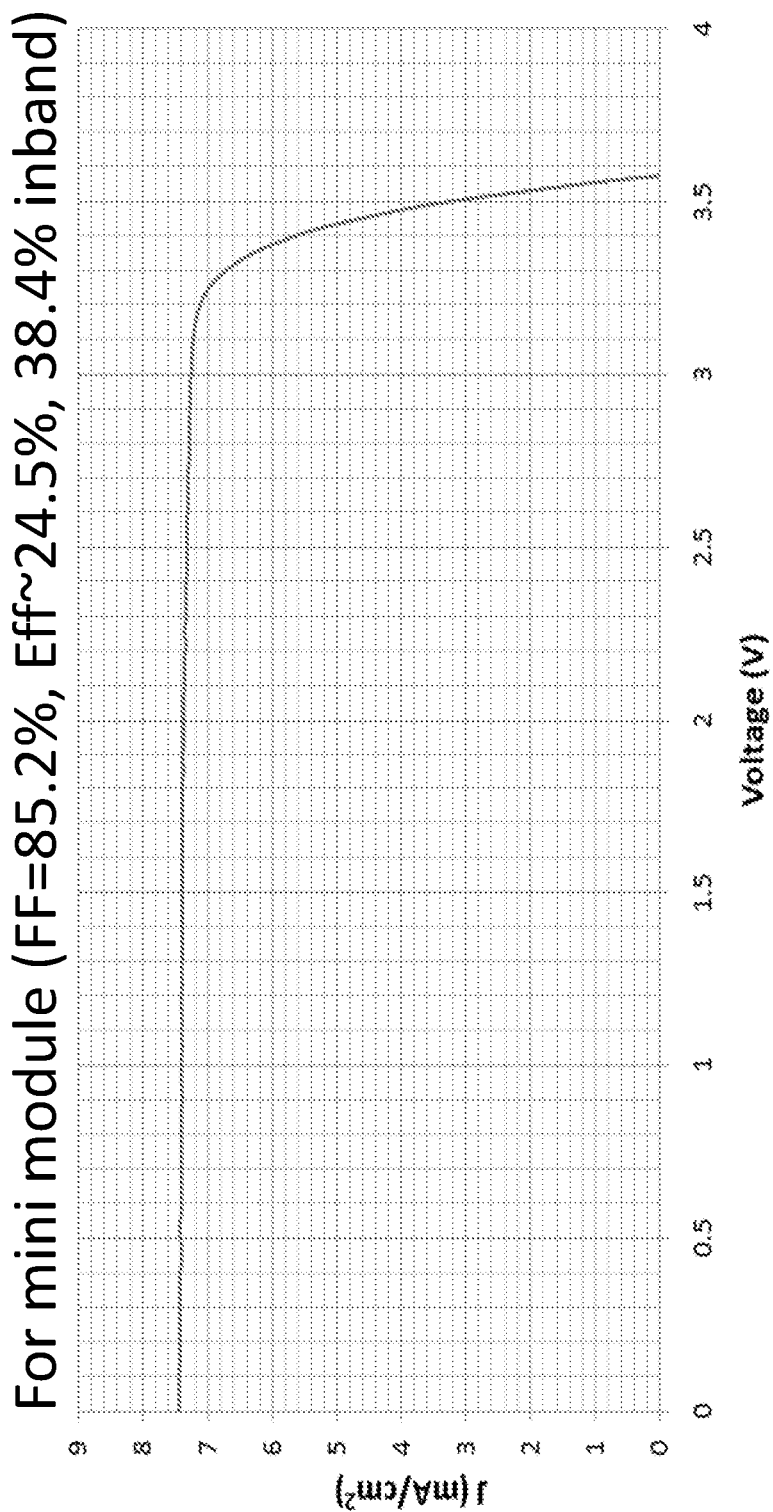
Figure 27:
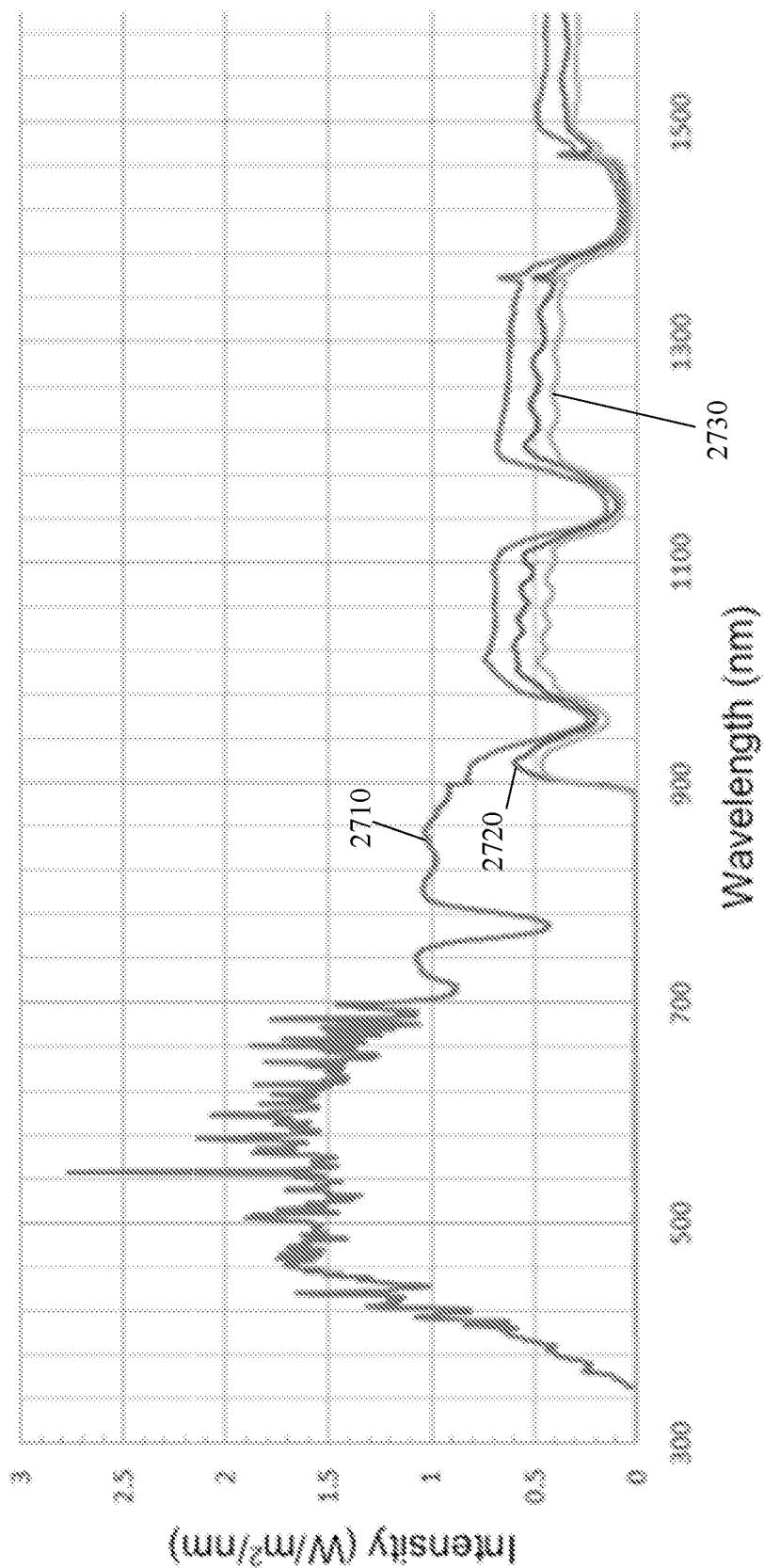
FIG. 27 shows the solar spectrum AMD1.5 (top line), transmitted spectrum through one cell (second line), and the transmitted spectrum through the mini-module (bottom line), which includes top and bottom window, encapsulant, photovoltaic cells, and electrical connections.

Preliminary testing on the tCPV module has shown efficiencies close to predicted values. FIG. 25 shows the IV curve for an isolated photovoltaic cell with 42.2% in band efficiency. FIG. 26 is an IV curve for two cells placed in parallel within a mock-up of the tCPV including windows, electrodes, and encapsulant. The performance is reduced slightly to 38.4% due to the absence of anti-reflection coatings and low transmissivity glass. FIG. 27 demonstrates the wavelength selectivity of the photovoltaic cells. The top curve shows the AMD1.5 solar spectrum as calibrated in the solar simulator. The second line is a measurement of the solar spectrum with a bare cell in the path. The lack of signal in the visible region (<870 nm) demonstrates that the visible light is absorbed within the cell while infrared light is able to pass through. The bottom line shows the absorption within the visible region for the 2-cell module described above. There is only minor attenuation between the single cell and the mini-module construct, demonstrating high transmissivity. Transmissivity may be further increased through advances in production.

Materials and Methods

Figure 24:
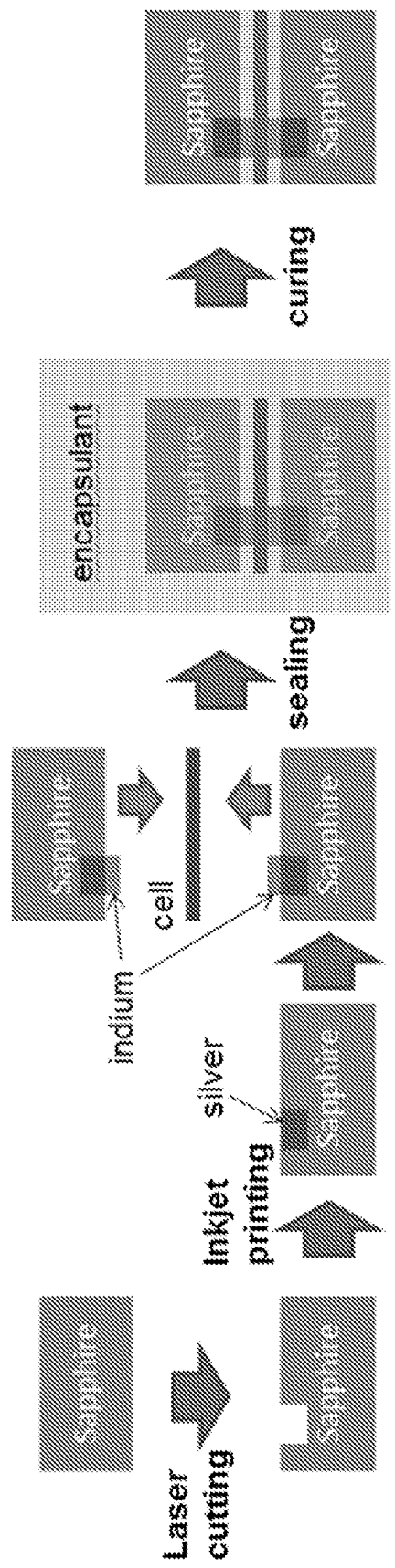
FIG. 24 shows a schematic of a potential manufacturing process for one embodiment of the passive cooling tCPV module.

One method for the construction of an embodiment of the tCPV module with passive cooling can be seen in FIG. 24. Channels are etched into a sapphire window through at least one method selected from the group comprising wet chemical process, dry etch process, laser machining, or mechanical micromachining, to form an electrode pattern. Embedded electrodes are formed through inkjet printing, doctor blading, or electrodeposition. These electrodes may be silver, copper, or any other appropriate material. Photovoltaic cells are bonded to the electrodes; in some embodiments, indium paint is used as the bonding agent. A top window with similarly prepared embedded electrodes is bonded onto the cells. The window may be comprised of glass, sapphire, or any other appropriate material and may be bonded using indium paste, indium paint, or any other appropriate bonding agent. The module is submerged into an encapsulant such as polysiloxane and is put under vacuum for about 6-48 hours to remove any trapped air within the encapsulant. Finally, the encapsulant is cured at room temperature to about 100° C. and excess encapsulant is removed.

A passive heat sink is constructed from a high thermal conductivity material such as aluminium alloy. The central collar piece may be machined on a lathe or a CNC machine. A plurality of fins (see, e.g., fins 385 in FIG. 3) may be formed through stamping, machining, laser cutting, or water jet cutting process. The fins 385 may be fixed onto the central collar (see, e.g., collar 380 in FIG. 3) through a slot fit design or a brazing process and may be positioned in several orientations, including flushed, flared, or inverted relative to the central collar. The dimensions of the fins may be increased as needed in order to improve cooling power. The fins may be formed in a number of different geometries to accommodate different fin positions and other system geometries. The tCPV module may be fixed within the heat sink through a shrink fit or clamping method or any other appropriate means.

In some embodiments, the construction of the actively-cooled tCPV module is similar to that of the passively-cooled module except for the materials and dimensions used. A thin window is etched and filled with electrodes as described above. This window may be comprised of sapphire, glass, or any other appropriate material. Cells are bonded to the electrodes using indium paint, indium paste, or any other appropriate bonding agent, and a top window made of fused quartz, borosilicate glass, NBK7 glass or any other appropriate material, with embedded electrodes, is bonded to the cells with indium paint, indium paste, or any other appropriate bonding agent. In this embodiment, the encapsulation process for the active cooling system is the same as for the passive cooling system.

In some embodiments, the active cooling method relies on a microfluidic channel plate to be bonded onto the encapsulant in order to deliver a heat transfer fluid to the bottom of the cells. The channel plate may be formed by etching about 50-about 100 micron channels into an about 3 mm NBK7 glass window. Inlet and outlet holes are machined into each end of the channels. The channel plate is bonded onto the module through a plasma bonding process or through any other appropriate boding method. Encapsulant such as polysiloxane may be patterned onto the channel plate in non-channel regions. The module and channel plate may be placed in a cleaner, such as an oxygen plasma cleaner, and processed. Immediately after processing, the pieces are brought together to bond.

In some embodiments, delivery of heat transfer fluid relies on an active cooling collar to align the module and provide electrical and plumbing connections. The collar may be made of a high thermal conductivity material such an aluminium alloy and may be manufactured by investment casting, direct metal laser sintering, a combination of machining processes, or any other appropriate method. In some embodiments, the collar has two interior manifold channels leading to a total of 14 feed lines to deliver heat transfer fluid into the microfluidic channel plate. The inlet of the manifold is fed from a small fluid pump. The outlet of the manifold leads to a heat exchanger located some distance from the module as shown in FIG. 15 in order to return the heat transfer fluid to base temperature. The heat transfer fluid may be comprised of water, water with ethylene glycol, synthetic oils, or any other appropriate fluid.

What is claimed is:

1. An apparatus comprising:
   a concentrator;
   a transmissive concentrating photovoltaic (tCPV) module;
   a thermal receiver; and
   a support adapted to position the tCPV module and the thermal receiver along an optical axis of the concentrator such that:
      the tCPV module is located between the concentrator and the thermal receiver;
      the tCPV module faces the concentrator to receive concentrated sunlight therefrom;
      the thermal receiver faces the tCPV module; and
      the thermal receiver and the tCPV module are thermally isolated from each other to reduce heat flow therebetween;
   the tCPV module comprising:
      an optically transmissive substrate having opposed first and second surfaces;
      photovoltaic cells for converting a first portion of the concentrated sunlight into electrical energy, the photovoltaic cells being located adjacent to the first surface such that a second portion of the concentrated sunlight that is transmitted through the photovoltaic cells enters the optically transmissive substrate via the first surface; and
      an optically transmissive base having opposed third and fourth surfaces, the optically transmissive base forming one or more fluid channels that extend partially into the optically transmissive base from the third surface;
      the third surface directly contacting the second surface such that:
         (i) the second surface seals the one or more fluid channels;
         (ii) optically transparent heat-transfer fluid flowing through the one or more fluid channels directly contacts the second surface to conduct heat away from the optically transmissive substrate; and
         (iii) the second portion of the concentrated sunlight is transmitted through the optically transparent heat-transfer fluid to enter the optically transmissive base;
   wherein the thermal receiver:
      forms an input aperture that faces the fourth surface such that the second portion of the concentrated sunlight, after being transmitted through the optically transmissive base, passes through the input aperture to enter the thermal receiver;
      converts, into thermal energy, at least some of the second portion of the concentrated sunlight entering the thermal receiver; and
      outputs the thermal energy.

2. The apparatus of claim 1, wherein the optically transmissive substrate, the photovoltaic cells, the optically transmissive base, and the optically transmissive heat-transfer fluid are at least partially transmissive to the concentrated sunlight.

3. The apparatus of claim 1, wherein the optically transmissive base is comprised of a material selected from the group consisting of: sapphire, fused quartz, fused silica, and borosilicate glass.

4. The apparatus of claim 1, wherein a depth of each of the one or more fluid channels is between 50 and 200 microns.

5. The apparatus of claim 1, wherein:
each fluid channel, of the one or more fluid channels, runs underneath a corresponding row of the photovoltaic cells; and
a width of said each fluid channel is at least a width of the photovoltaic cells in the corresponding row.

6. The apparatus of claim 1, further comprising:
an inlet manifold for guiding the optically transmissive heat-transfer fluid into the one or more fluid channels; and
an outlet manifold for guiding the optically transmissive heat-transfer fluid out of the one or more fluid channels.

7. The apparatus of claim 1, further comprising a pump for pumping the optically transmissive heat-transfer fluid through the one or more fluid channels.

8. The apparatus of claim 1, wherein the optically transmissive heat-transfer fluid comprises one or more of: water, ethylene glycol, and synthetic oil.

9. The apparatus of claim 1, further comprising a heat exchanger for removing heat from the optically transmissive heat-transfer fluid.

10. A method for converting solar energy, comprising:
concentrating, with the concentrator of the apparatus of claim 1, incident sunlight into concentrated sunlight;
converting, with the photovoltaic cells of the apparatus, a first portion of the concentrated sunlight into electrical energy;
flowing optically transmissive heat-transfer fluid through the one or more fluid channels of the apparatus;
converting, with the thermal receiver of the apparatus, a second portion of the concentrated sunlight into thermal energy; and
outputting the thermal energy.

11. The method of claim 10, wherein the optically transmissive heat-transfer fluid comprises one or more of: water, ethylene glycol, and synthetic oil.

12. The method of claim 10, further comprising:
guiding the optically transmissive heat-transfer fluid into the one or more fluid channels; and
guiding the optically transmissive heat-transfer fluid out of the one or more fluid channels.

13. The method of claim 10, further comprising pumping the optically transmissive heat-transfer fluid with a pump.

14. The method of claim 13, further comprising powering the pump with the electrical energy from the photovoltaic cells.

15. The method of claim 10, further comprising removing, with a heat exchanger, heat from the optically transmissive heat-transfer fluid.

16. The method of claim 10, wherein a concentration of the concentrated sunlight, at the photovoltaic cells, is 50 suns or higher.

17. The method of claim 10, further comprising cooling the optically transmissive heat-transfer fluid with a forced-air radiator.

18. The method of claim 17, further comprising powering the forced-air radiator with the electrical energy from the photovoltaic cells.

19. The method of claim 10, further comprising moving the support and the concentrator with an actuator.

\* \* \* \* \*